(12) United States Patent
Piper et al.

(10) Patent No.: US 12,405,419 B2
(45) Date of Patent: Sep. 2, 2025

(54) PHOTONIC INTEGRATED CIRCUIT FOR AMPLIFYING OPTICAL SIGNALS

(71) Applicant: DenseLight Semiconductors Pte Ltd, Singapore (SG)

(72) Inventors: Andy Piper, Singapore (SG); Ter Hoe Loh, Singapore (SG); Hon Yuen Aaron Sim, Singapore (SG); Long Cheng Koh, Singapore (SG); Yuen Chuen Chan, Singapore (SG); Yee Loy Lam, Singapore (SG)

(73) Assignee: DenseLight Semiconductors Pte Ltd, Singapore (SG)

( * ) Notice: Subject to any disclaimer, the term of this patent is extended or adjusted under 35 U.S.C. 154(b) by 1087 days.

(21) Appl. No.: 17/373,232

(22) Filed: Jul. 12, 2021

(65) Prior Publication Data
US 2022/0019021 A1  Jan. 20, 2022

Related U.S. Application Data

(60) Provisional application No. 63/051,606, filed on Jul. 14, 2020.

(51) Int. Cl.
| | |
|---|---|
| *G02B 6/12* | (2006.01) |
| *G02B 6/028* | (2006.01) |
| *G02B 6/122* | (2006.01) |
| *G02B 6/28* | (2006.01) |
| *H01S 3/067* | (2006.01) |

(52) U.S. Cl.
CPC ....... *G02B 6/12004* (2013.01); *G02B 6/0288* (2013.01); *G02B 6/1228* (2013.01); *G02B 6/2813* (2013.01); *H01S 3/0675* (2013.01); *H01S 3/06754* (2013.01); *G02B 2006/12061* (2013.01); *G02B 2006/12147* (2013.01); *G02B 2006/1215* (2013.01)

(58) Field of Classification Search
CPC ........................................... G02B 2006/12119
See application file for complete search history.

(56) References Cited

U.S. PATENT DOCUMENTS

| | | | | |
|---|---|---|---|---|
| 4,736,164 A | * | 4/1988 | Henning | ........... H01S 5/50 359/344 |
| 6,882,764 B1 | * | 4/2005 | Deng | ........... G02B 6/2766 359/333 |
| 8,380,016 B1 | | 2/2013 | Hochberg et al. | |

(Continued)

FOREIGN PATENT DOCUMENTS

| | | |
|---|---|---|
| CN | 103487881 A | 1/2014 |
| KR | 10-2013-0118384 A | 10/2013 |

*Primary Examiner* — Eric L Bolda
(74) *Attorney, Agent, or Firm* — CHIP Law Group

(57) ABSTRACT

A photonic integrated circuit (PIC) includes various mode field adapters (MFAs), a waveguide, and various contact pads. All the MFAs are on a same facet of the PIC. One MFA of the PIC outputs a first optical signal that is an amplified version of a second optical signal. The waveguide is divided into two waveguide arms and a bend portion to join the two waveguide arms. The waveguide extends between the MFAs such that the second optical signal propagates through the waveguide. Further, each waveguide arm is formed between the contact pads. The second optical signal propagating through the waveguide is amplified based on a current that is injected in the PIC by way of the contact pads.

17 Claims, 16 Drawing Sheets

(56) References Cited

U.S. PATENT DOCUMENTS

| | | | |
|---|---|---|---|
| 10,320,151 B1* | 6/2019 | Traverso | H01S 5/1203 |
| 2003/0235378 A1* | 12/2003 | Yamaguchi | G02B 6/4246 |
| | | | 385/92 |
| 2015/0236473 A1* | 8/2015 | Lee | G02B 1/113 |
| | | | 359/245 |
| 2018/0284345 A1 | 10/2018 | Kojima et al. | |
| 2020/0212651 A1 | 7/2020 | Nagarajan et al. | |
| 2021/0066537 A1* | 3/2021 | Yu | H01S 5/02326 |
| 2021/0126428 A1* | 4/2021 | Fujiwara | H01S 5/3434 |
| 2022/0155521 A1* | 5/2022 | Yu | G02B 6/13 |
| 2022/0276438 A1* | 9/2022 | Yu | G02B 6/124 |

* cited by examiner

PHOTONIC INTEGRATED CIRCUIT FOR AMPLIFYING OPTICAL SIGNALS

CROSS-RELATED APPLICATIONS

This application claims priority of U.S. Provisional Application No. 63/051,606, filed Jul. 14, 2020, the contents of which are incorporated herein by reference.

FIELD

Various embodiments of the disclosure relate generally to photonic circuits in optical communication. More particularly, various embodiments of the present disclosure relate to a photonic integrated circuit (PIC) for amplifying optical signals.

BACKGROUND

A silicon photonic device includes numerous PICs for executing various operations. A common example of the PIC is a semiconductor optical amplifier that amplifies optical signals. Such a PIC includes a waveguide that receives an optical signal at an input port of the PIC from another waveguide of the silicon photonic device, and outputs and provides, to a different waveguide of the silicon photonic device, an amplified version of the optical signal at an output port of the PIC. The input and output ports of the PIC are formed at opposite facets of the PIC.

To reduce optical loss in the PIC due to reflection, the two facets of the PIC having the input and output ports are coated with an anti-reflection (AR) coating. Such an AR coating is typically deposited in separate runs for each of the input and output ports, thereby leading to variations in the AR coating at the input and output ports of the PIC. The variations in the AR coating degrade an optical performance of the PIC. Further, to obtain a desired optical gain, a length of the waveguide of the PIC is required to be significant. This leads to the PIC having a significant size and manufacturing cost.

Limitations and disadvantages of conventional and traditional approaches will become apparent to one of skill in the art, through comparison of described systems with some aspects of the present disclosure, as set forth in the remainder of the present application and with reference to the drawings.

SUMMARY

Photonic integrated circuits for amplifying optical signals are provided substantially as shown in, and described in connection with, at least one of the figures, as set forth more completely in the claims.

These and other features and advantages of the present disclosure may be appreciated from a review of the following detailed description of the present disclosure, along with the accompanying figures in which like reference numerals refer to like parts throughout.

DETAILED DESCRIPTION

Figure 1:
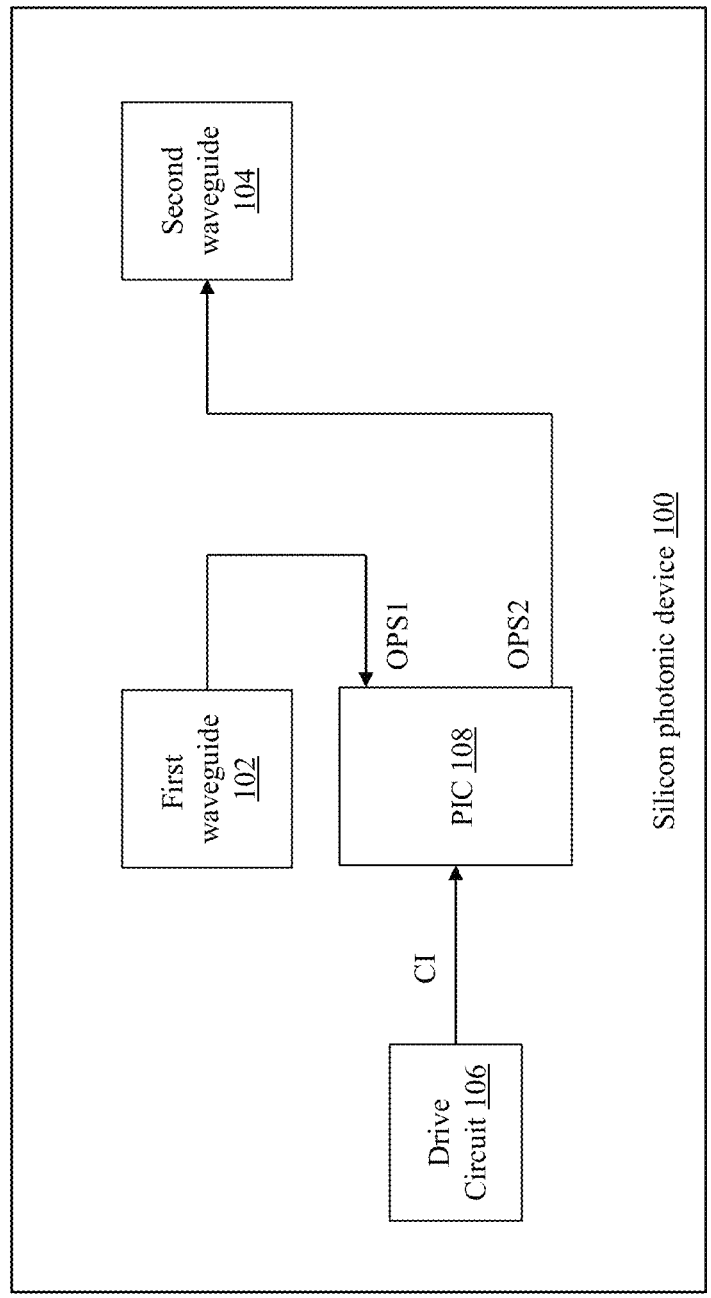
FIG. 1 is a schematic block diagram that illustrates a silicon photonic device, in accordance with an exemplary embodiment of the present disclosure.

Certain embodiments of the disclosure may be found in the disclosed photonic integrated circuit (PIC). The PIC can be included on a silicon photonic device. The PIC includes a first mode field adapter (MFA), a second MFA, a first waveguide, a first plurality of contact pads, a second plurality of contact pads, and a third plurality of contact pads. The first and second MFAs are on a same facet of the PIC. One of the first and second MFAs is configured to output a first optical signal that is an amplified version of a second optical signal. The second optical signal is one of generated in the PIC and received by the PIC. The first waveguide extends between the first and second MFAs such that the second optical signal propagates through the first waveguide. The first waveguide is divided into a first waveguide arm, a second waveguide arm, and a bend portion. The bend portion joins the first and second waveguide arms. Further, the first waveguide is configured to amplify the second optical signal based on a current injected in the PIC. The first waveguide arm is between the first and second pluralities of contact pads, and the second waveguide arm is between the first and third pluralities of contact pads. The current is injected in the PIC by way of the first plurality of contact pads, the second plurality of contact pads, and the third plurality of contact pads.

In some embodiments, the first waveguide corresponds to one of a high index contrast waveguide and a medium index contrast waveguide.

In some embodiments, the PIC further includes an anti-reflection coating on the facet.

In some embodiments, the PIC further includes a set of markers to align the PIC on the silicon photonic device.

In some embodiments, the PIC further includes a first waveguide structure, a second waveguide structure, and a third waveguide structure. The first plurality of contact pads are above the first waveguide structure and the second and third pluralities of contact pads are above the second waveguide structure. The third waveguide structure corresponds to the first waveguide.

In some embodiments, each waveguide structure of the first waveguide structure, the second waveguide structure, and the third waveguide structure includes a first clad layer, an active waveguide core on the first clad layer, and a second clad layer on the active waveguide core In some embodiments, each MFA of the first and second MFAs includes a second waveguide that is configured to one of receive the second optical signal and output the first optical signal. Each MFA of the first and second MFAs further includes a tapered active waveguide core that extends between the second waveguide and the first waveguide. The tapered active waveguide core enables one of propagation of the second optical signal from the second waveguide to the first waveguide arm, and propagation of the first optical signal from the second waveguide arm to the second waveguide.

In some embodiments, each MFA of the first and second MFAs further comprises a third waveguide that is below the second waveguide. The second waveguide receives the second optical signal and outputs the first optical signal by way of the third waveguide.

In some embodiments, the PIC further includes a first contact layer, a first dielectric layer, and first and second metal layers. The first contact layer is on the first waveguide structure, the second waveguide structure, and the third waveguide structure. The first dielectric layer is on sidewalls of the third waveguide structure, and on the first contact layer that is associated with the first waveguide structure. The first dielectric layer is further in a first region between the first and third waveguide structures, and a second region between the second and third waveguide structures. The first metal layer is on the first dielectric layer and the first contact layer associated with the third waveguide structure. Each contact pad of the first plurality of contact pads is on a portion of the first metal layer that is above the first waveguide structure. The second metal layer is on the first contact layer associated with the second waveguide structure. The second metal layer is further in the second region between the second and third waveguide structures such that the second metal layer overlaps with the first dielectric layer. Each contact pad of the second and third pluralities of contact pads is on a portion of the second metal layer that is above the second waveguide structure.

In some embodiments, the PIC further includes a substrate and a second contact layer that is above the substrate such that the second waveguide is between the second contact layer and the substrate. The first waveguide structure, the second waveguide structure, and the third waveguide structure are on the second contact layer.

In some embodiments, the PIC further includes a substrate and a second contact layer that is on the substrate. The second waveguide is between the second contact layer and the first, second, and third waveguide structures.

In some embodiments, the PIC further includes a second dielectric layer that is on the first and second metal layers for passivation such that the first plurality of contact pads, the second plurality of contact pads, and the third plurality of contact pads are uncovered by the second dielectric layer.

In some embodiments, the PIC further includes a first contact layer, a first dielectric layer, and a first metal layer. The first contact layer is on the first waveguide structure, the second waveguide structure, and the third waveguide structure. The first dielectric layer is on sidewalls of the third waveguide structure, and on the first contact layer that is associated with the first and second waveguide structures. The first dielectric layer is further in a first region between the first and third waveguide structures, and a second region between the second and third waveguide structures. The first metal layer is on the first dielectric layer and the first contact layer associated with the third waveguide structure. Each contact pad of the first plurality of contact pads is on a portion of the first metal layer that is above the first waveguide structure, and each contact pad of the second and third pluralities of contact pads is on a portion of the first metal layer that is above the second waveguide structure.

In some embodiments, the PIC further includes a second metal layer and a substrate that is on the second metal layer. The first waveguide structure, the second waveguide structure, and the third waveguide structure are above the substrate.

In some embodiments, the PIC further includes a grating on the second waveguide arm of the first waveguide. The grating is configured to reflect the second optical signal that propagates through the first waveguide such that the first optical signal is outputted by way of the first MFA.

In some embodiments, the PIC further includes a multimode interference (MMI) coupler on the first and second waveguide arms of the first waveguide. The MMI coupler is configured to receive the second optical signal by way of the first waveguide arm and the first MFA, and split the second optical signal into third and fourth optical signals. The second optical signal is split into the third and fourth optical signals such that the third optical signal propagates from the first waveguide arm to the second waveguide arm by way of the bend portion. Further, the fourth optical signal propagates from the second waveguide arm to the first waveguide arm by way of the bend portion. The MMI coupler is further configured to output the first optical signal by combining the third and fourth optical signals. The MMI coupler outputs the first optical signal by way of the second waveguide arm and the second MFA.

In some embodiments, the PIC further includes a distributed feedback (DFB) laser that is on the second waveguide arm of the first waveguide. The DFB laser is configured to generate the second optical signal. The second optical signal propagates through the first waveguide such that the first optical signal is outputted by way of the first MFA.

In some embodiments, the PIC further includes a distributed Bragg reflector (DBR) on the second waveguide arm of the first waveguide such that the PIC corresponds to a tunable laser. The bend portion of the first waveguide corresponds to a gain section of the tunable laser and the first waveguide arm of the first waveguide corresponds to a phase section of the tunable laser. The tunable laser can be configured to output the first optical signal by way of the first MFA.

The systems of the present disclosure provide a solution for a compact and optimal PIC. The first waveguide of the PIC has a loop-back structure. Hence, input and output ports of the PIC (e.g., the first and second MFAs) are on the same facet of the PIC. Thus, the AR coating is required on a single facet of the PIC, and is deposited in a single run. As a result, the AR coating at the input and output ports of the PIC is uniform and does not experience variations arising from two separate deposition runs. Hence, an optical performance of the PIC of the present disclosure is greater than that of a conventional PIC where input and output ports are on opposite facets of the PIC, and hence, separate runs of AR coating deposition are required. Further, the first waveguide can correspond to one of a high index contrast waveguide and a medium index contrast waveguide. Utilization of such a waveguide reduces optical reflection at bends of the waveguide, which in turn reduces a radius of curvature of the bend portion. Thus, a size of the first waveguide of the present disclosure having the loop-back structure is less than that of a conventional waveguide having an elongated straight structure, even when the interaction length is same for both the waveguides. Hence, a size and a manufacturing cost of the PIC of the present disclosure are less than that of the conventional PIC.

A "metal" as used herein and throughout this disclosure refers to, but is not limited to, a material (element, compound, and alloy) that has good electrical and thermal conductivity. This may include, but is not limited to, gold, zinc, chromium, aluminum, silver, platinum, nickel, copper, rhodium, palladium, tungsten, and combinations of such materials.

A "contact" as used herein and throughout this disclosure refers to, but is not limited to, a material having good electrical conductivity and that is optically opaque. This includes structures formed from thin films, thick films, and plated films for example of materials including, but not limited to, metals such as gold, zinc, chromium, aluminum, silver, platinum, nickel, copper, rhodium, palladium, tungsten, and combinations of such materials. Other contact configurations may employ combinations of metals, for example, a chromium adhesion layer and a gold electrode layer.

A "substrate" as used herein and throughout this disclosure refers to, but is not limited to, a surface upon which semiconductor structures are formed. This may include, but is not limited to, indium phosphide (InP), gallium arsenide (GaAs), silicon, silica-on-silicon, silica, silica-on-polymer, glass, a metal, a ceramic, a polymer, or a combination thereof.

FIG. 1 is a schematic block diagram that illustrates a silicon photonic device, in accordance with an exemplary embodiment of the present disclosure. Referring to FIG. 1, there is shown a silicon photonic device 100 that includes first and second waveguides 102 and 104 a drive circuit 106, and a photonic integrated circuit (PIC) 108.

The first and second waveguides 102 and 104 are coupled to the PIC 108. The first and second waveguides 102 and 104 are further coupled to first and second optical circuits (not shown) of the silicon photonic device 100. The first waveguide 102 is configured to receive a first optical signal OPS1 from the first optical circuit, and provide the first optical signal OPS1 to the PIC 108. Further, the second waveguide 104 can be configured to receive a second optical signal OPS2 from the PIC 108. The second optical signal OPS2 is an amplified version of the first optical signal OPS1. In an example, the first and second optical signals OPS1 and OPS2 have wavelengths in a 1.3 micrometer band. Further, the second waveguide 104 can be configured to provide the second optical signal OPS2 to the second optical circuit. The second optical circuit can execute various operations associated therewith based on the second optical signal OPS2. Although it is shown that the first and second waveguides 102 and 104 are directly coupled to the PIC 108, the scope of the present disclosure is not limited to it. In various other embodiments, the first and second waveguides 102 and 104 can be coupled to the PIC 108 by way of first and second lenses (not shown), respectively, without deviating from the scope of the present disclosure.

The drive circuit 106 is coupled to the PIC 108. The drive circuit 106 is configured to generate a current CI. Further, the drive circuit 106 is configured to inject the current CI in the PIC 108 (i.e., provide the current CI to the PIC 108). The injected current CI enables the amplification operation of the PIC 108. Although it is shown that the silicon photonic device 100 includes the drive circuit 106, the scope of the present disclosure is not limited to it. In various other embodiments, the drive circuit 106 can be external to the silicon photonic device 100, without deviating from the scope of the present disclosure.

Figure 12:
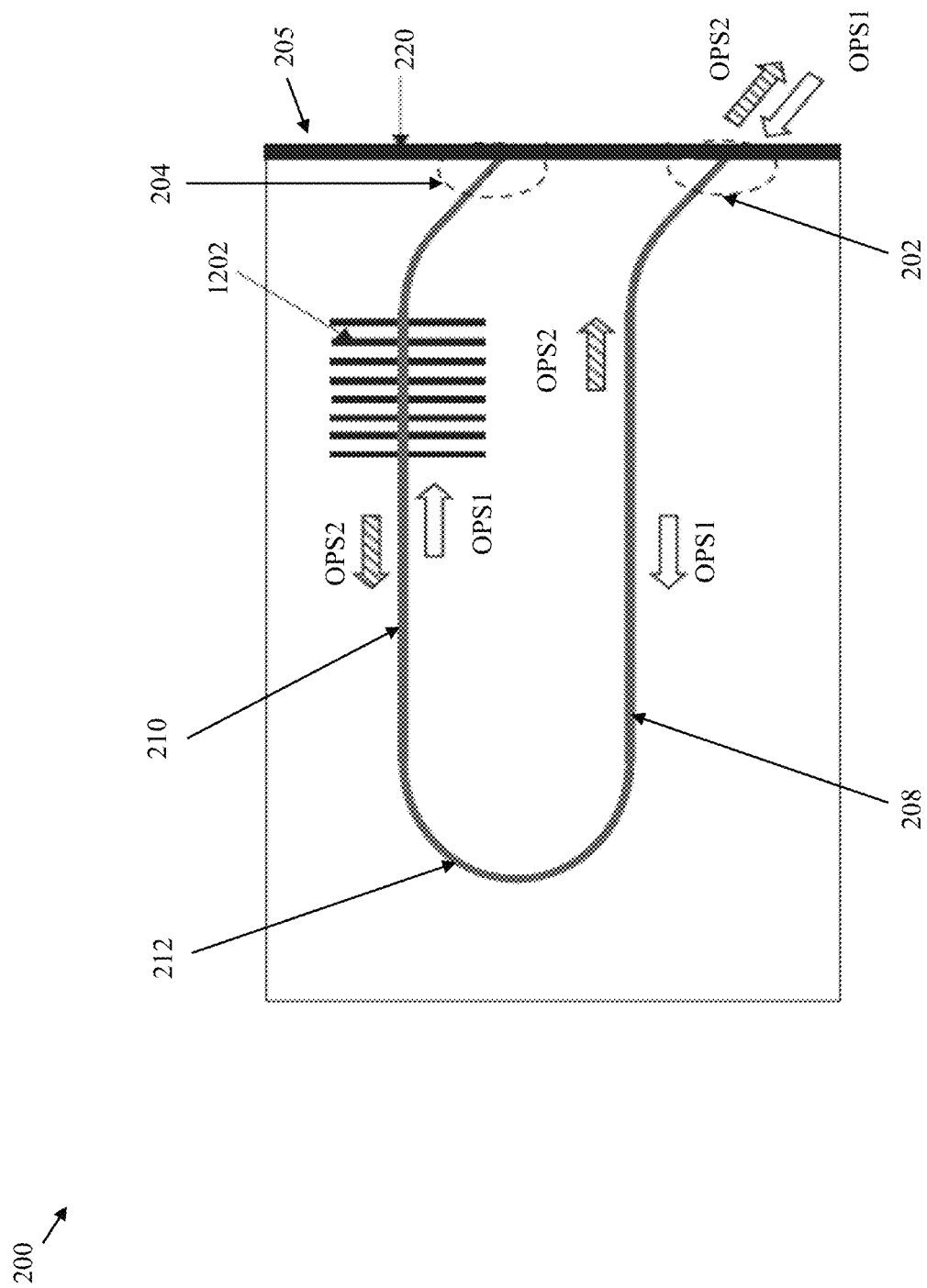
FIG. 12 is a schematic diagram that illustrates the top view of the PIC of the silicon photonic device of FIG. 1, in accordance with another exemplary embodiment of the present disclosure.
Figure 13:
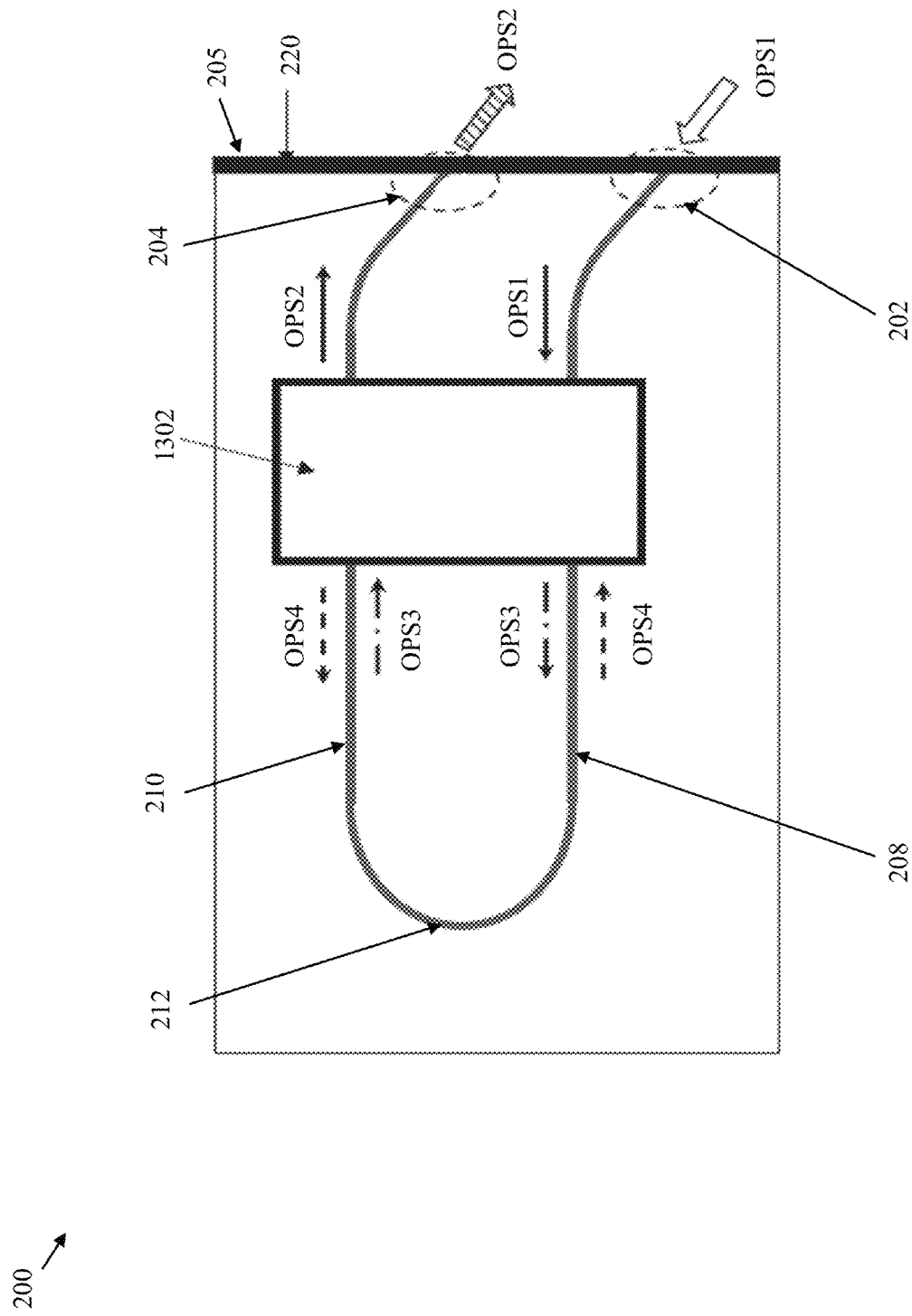
FIG. 13 is a schematic diagram that illustrates the top view of the PIC of the silicon photonic device of FIG. 1, in accordance with yet another exemplary embodiment of the present disclosure.

The PIC 108 is coupled to the first and second waveguides 102 and 104 and the drive circuit 106. The PIC 108 is configured to receive the current CI from the drive circuit 106, and the first optical signal OPS1 from the first waveguide 102. In an embodiment, the PIC 108 receives the first optical signal OPS1 at a first port (shown later in FIGS. 2 and 12-15) thereof. The first port of the PIC 108 can correspond to an input port of the PIC 108. Based on the current CI and the first optical signal OPS1, the PIC 108 is further configured to output the second optical signal OPS2. The second optical signal OPS2 is the amplified version of the first optical signal OPS1. In other words, the first optical signal OPS1 is amplified based on the current CI that is injected in the PIC 108. In an embodiment, the PIC 108 outputs the second optical signal OPS2 at a second port (shown later in FIGS. 2 and 12-15) thereof. The second port of the PIC 108 can correspond to an output port of the PIC 108. The first and second ports of the PIC 108 are on a same facet (shown later in FIG. 2) of the PIC 108. Further, the PIC 108 is configured to provide the second optical signal OPS2 to the second waveguide 104. In an embodiment, the PIC 108 corresponds to a semiconductor optical amplifier (SOA). Such a PIC 108 is illustrated in FIGS. 2-11. In another embodiment, the PIC 108 corresponds to a combination of the SOA and a multi-mode interference (MMI) coupler (shown later in FIG. 13). Such a PIC 108 is illustrated in FIG. 13.

Figure 14:
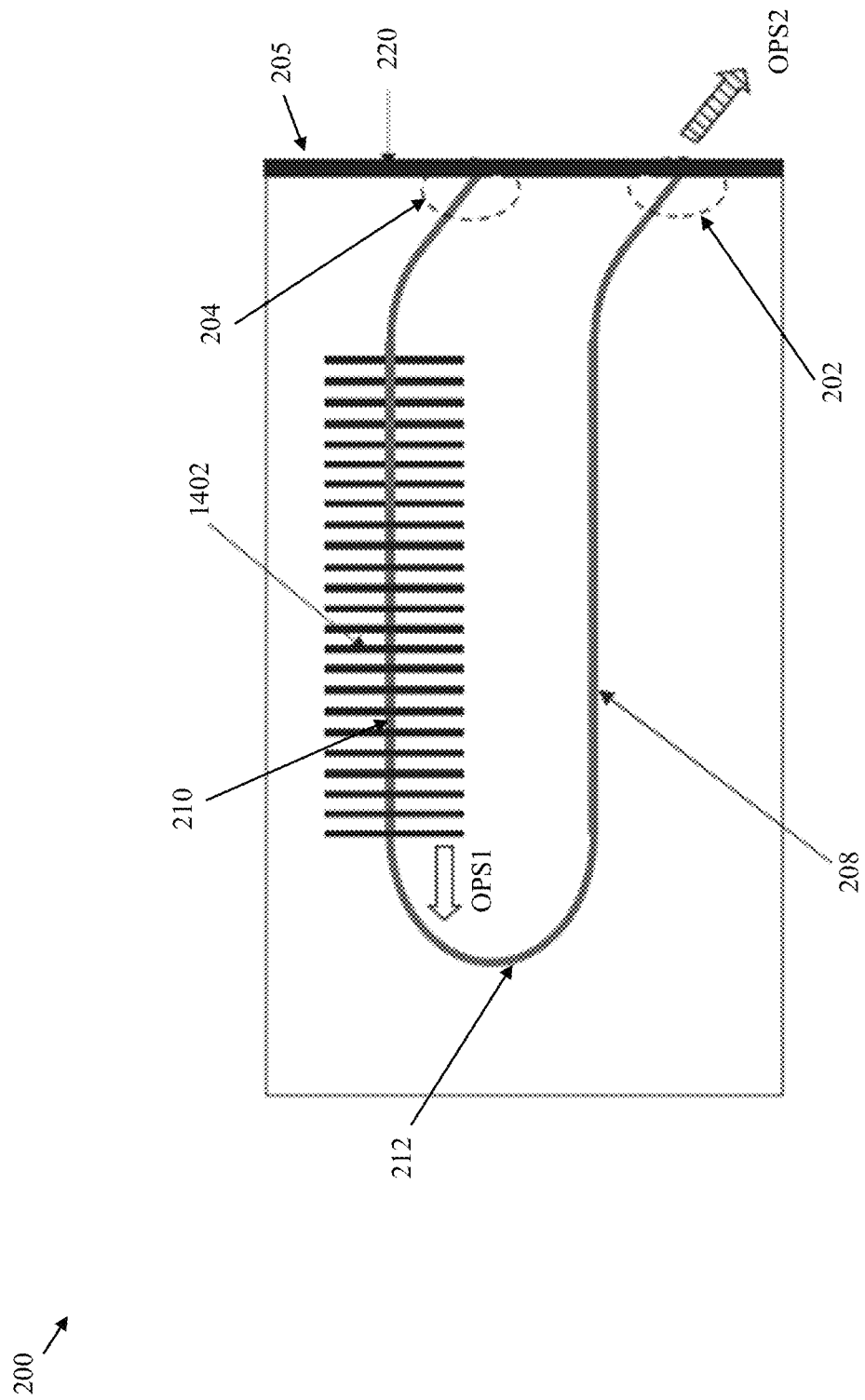
FIG. 14 is a schematic diagram that illustrates the top view of the PIC of the silicon photonic device of FIG. 1, in accordance with yet another exemplary embodiment of the present disclosure.
Figure 15:
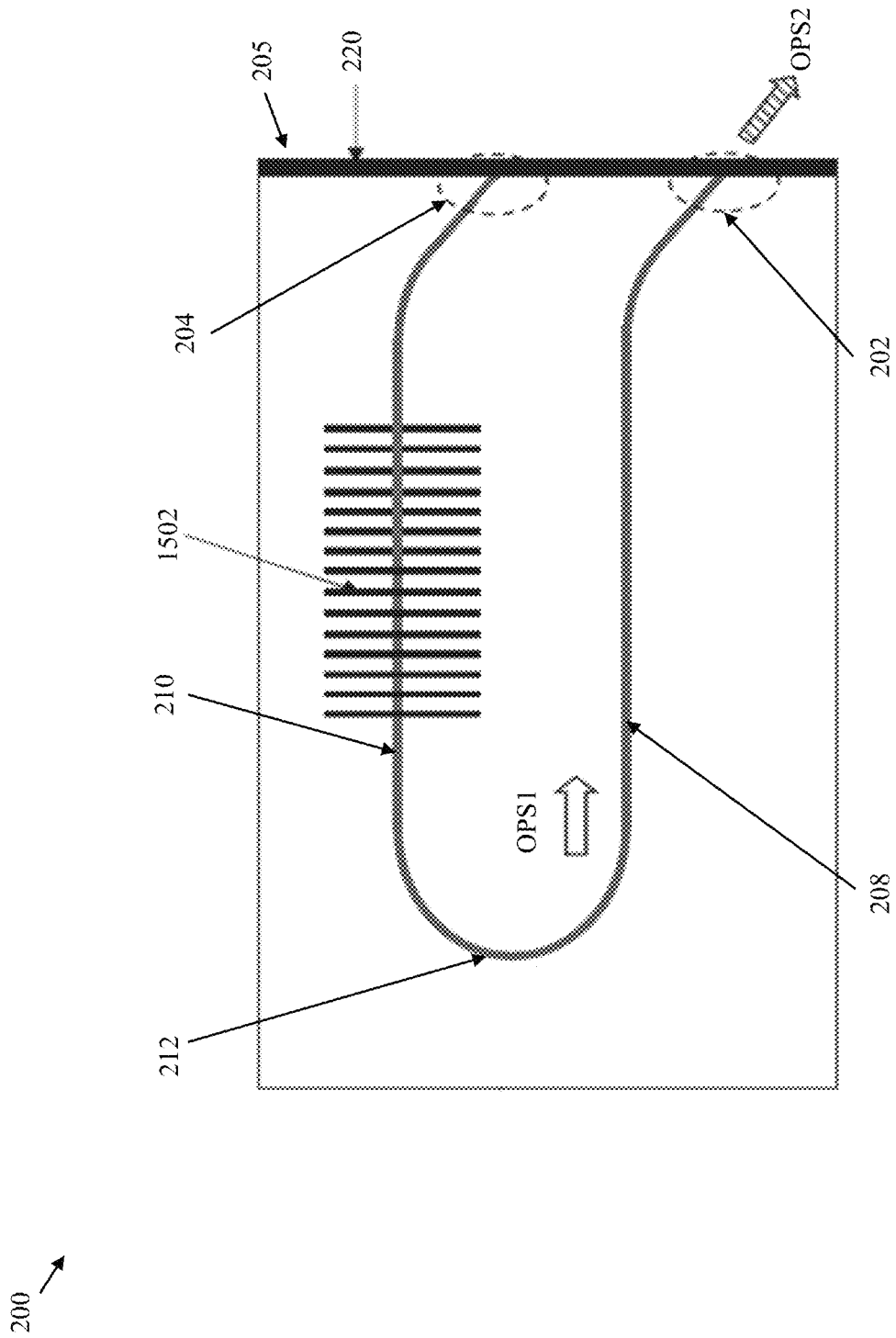
FIG. 15 is a schematic diagram that illustrates the top view of the PIC of the silicon photonic device of FIG. 1, in accordance with another exemplary embodiment of the present disclosure.

Although it is described that the PIC 108 provides the second optical signal OPS2 to the second waveguide 104 by way of the second port, the scope of the present disclosure is not limited to it. In various other embodiments, the PIC 108 can provide the second optical signal OPS2 to the first waveguide 102 by way of the first port, without deviating from the scope of the present disclosure. In such embodiments, the PIC 108 can correspond to a gain chip, a combination of the SOA and a distributed feedback (DFB) laser (shown later in FIG. 14), or a tunable laser. Such PICs 108 are illustrated in FIGS. 12, 14, and 15, respectively. Further, the scope of the present disclosure is not limited to the PIC 108 receiving the first optical signal OPS1 from the first waveguide 102. In various other embodiments, the PIC 108 can include various components (e.g., the DFB laser) that can be configured to generate the first optical signal OPS1, without deviating from the scope of the present disclosure. Such PICs 108 are illustrated in FIGS. 14 and 15.

Figure 2:
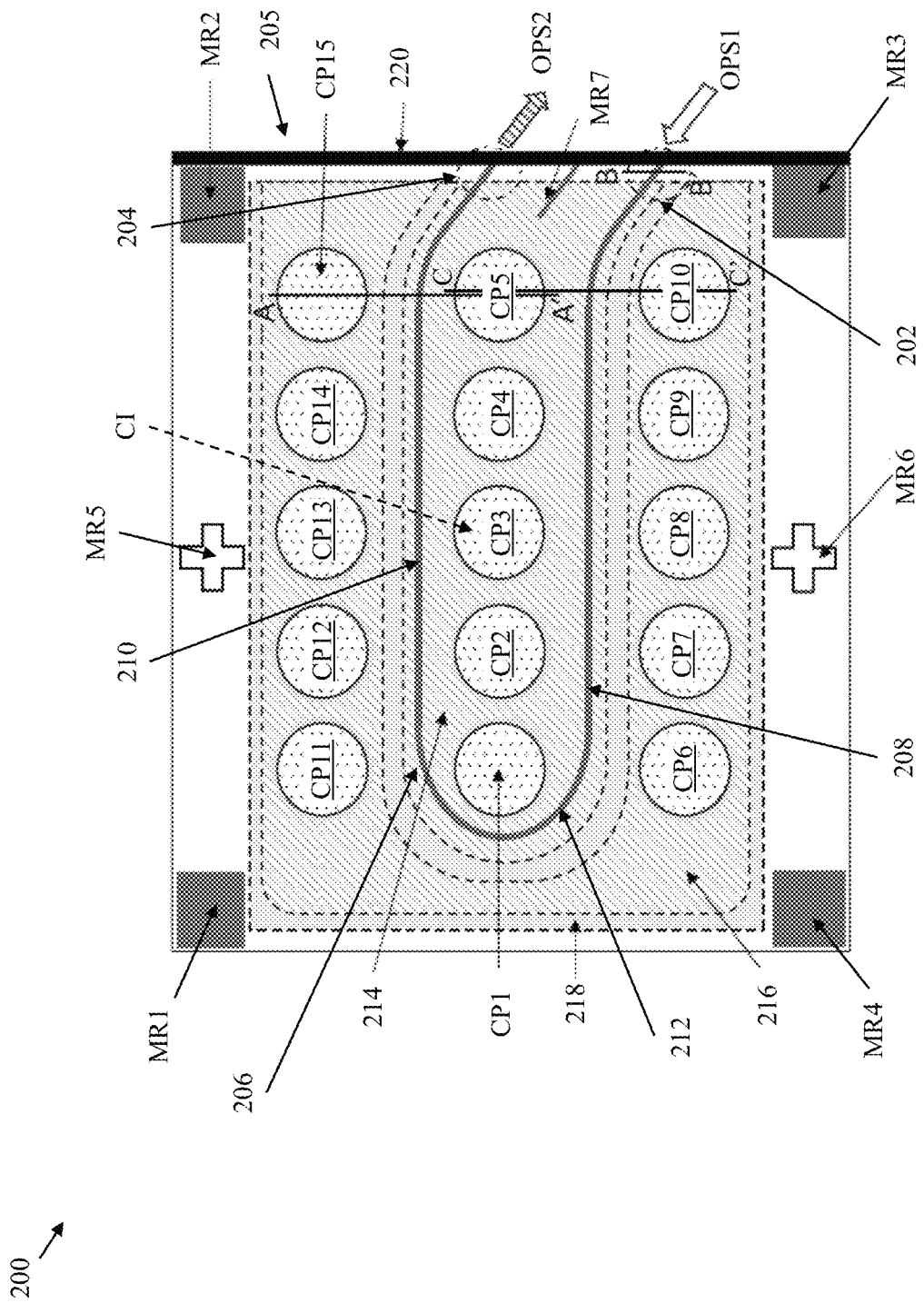
FIG. 2 is a schematic diagram that illustrates a top view of a photonic integrated circuit (PIC) of the silicon photonic device of FIG. 1, in accordance with an exemplary embodiment of the present disclosure.

FIG. 2 is a schematic diagram that illustrates a top view of a PIC of the silicon photonic device of FIG. 1, in accordance with an exemplary embodiment of the present disclosure. Referring to FIG. 2, there is shown a top view 200 of the PIC 108 that corresponds to the SOA.

The PIC 108 includes the first and second ports (designated as the "first and second ports 202 and 204"). The first and second ports 202 and 204 of the PIC 108 correspond to mode field adapters (MFAs). Hence, the first and second ports 202 and 204 of the PIC 108 are hereinafter referred to as the "first and second MFAs 202 and 204", respectively. The first and second MFAs 202 and 204 are coupled to the first and second waveguides 102 and 104, respectively, and are on the same facet (hereinafter referred to and designated as the "facet 205") of the PIC 108. The first MFA 202 is configured to receive the first optical signal OPS1 from the first waveguide 102, and the second MFA 204 is configured to output and provide the second optical signal OPS2 (i.e., the amplified version of the first optical signal OPS1) to the second waveguide 104.

The PIC 108 further includes a third waveguide 206 extending between the first and second MFAs 202 and 204 such that the first optical signal OPS1 propagates through the third waveguide 206. The third waveguide 206 is divided into first and second waveguide arms 208 and 210 that are integrated with the first and second MFAs 202 and 204, respectively, and a bend portion 212 that joins the first and second waveguide arms 208 and 210. As illustrated in FIG. 2, the bend portion 212 corresponds to a 180° bend with a predefined radius of curvature. However, the scope of the present disclosure is not limited to it. In an alternate embodiment, the bend portion 212 can include two curved sections joined by a straight section. The third waveguide 206 thus has a loop-back structure. The first optical signal OPS1 is amplified as the first optical signal OPS1 propagates through the third waveguide 206. In other words, the third waveguide 206 is configured to amplify the first optical signal OPS1. Further, the first and second waveguide arms 208 and 210 are angled (i.e., tilted) prior to integrating with the first and second MFAs 202 and 204, respectively, to regulate (i.e., reduce) optical reflection associated with the first and second optical signals OPS1 and OPS2. In an example, the first and second waveguide arms 208 and 210 are tilted at an angle between 7° to 12°. The third waveguide 206, in conjunction with the first and second MFAs 202 and 204, ensures continuity of optical propagation from the first waveguide 102 to the second waveguide 104 without any waveguide discontinuity. The third waveguide 206 corresponds to one of a high index contrast (HIC) waveguide and a medium index contrast (MIC) waveguide.

The PIC 108 further includes first through fifteenth contact pads CP1-CP15. The first through fifteenth contact pads CP1-CP15 are metal contacts that enable the injection of current CI in the PIC 108. The first through fifth contact pads CP1-CP5 are collectively referred to as a "first plurality of contact pads CP1-CP5", and the sixth through tenth contact pads CP6-CP10 are collectively referred to as a "second plurality of contact pads CP6-CP10". Similarly, the eleventh through fifteenth contact pads CP11-CP15 are collectively referred to as a "third plurality of contact pads CP11-CP15". In an embodiment, the first plurality of contact pads CP1-CP5 are p-type contact pads, and the second and third pluralities of contact pads CP6-CP10 and CP11-CP15 are n-type contact pads.

The first plurality of contact pads CP1-CP5 are formed between the second plurality of contact pads CP6-CP10 and the third plurality of contact pads CP11-CP15. Further, the first waveguide arm 208 is formed between the first plurality of contact pads CP1-CP5 and the second plurality of contact pads CP6-CP10. Similarly, the second waveguide arm 210 is formed between the first plurality of contact pads CP1-CP5 and the third plurality of contact pads CP11-CP15. The current CI can be injected in the PIC 108 by way of the first plurality of contact pads CP1-CP5, the second plurality of contact pads CP6-CP10, and the third plurality of contact pads CP11-CP15. As illustrated in FIG. 2, the current CI is injected in the third contact pad CP3. The first, second, fourth, and fifth contact pads CP1, CP2, CP4, and CP5 are electrically coupled to the third contact pad CP3. Thus, the first, second, fourth, and fifth contact pads CP1, CP2, CP4, and CP5 receive the current CI.

The current CI then propagates from the first through fifth contact pads CP1-CP5 to the sixth through tenth contact pads CP6-CP10, respectively. Such a current flow between the first plurality of contact pads CP1-CP5 and the second plurality of contact pads CP6-CP10 results in the amplification of the first optical signal OPS1 propagating through the first waveguide arm 208. The first optical signal OPS1 propagating through the first waveguide arm 208 is amplified based on stimulated emissions caused in the first waveguide arm 208 by the current CI. Similarly, the current CI propagates from the first through fifth contact pads CP1-CP5 to the eleventh through fifteenth contact pads CP11-CP15, respectively. Such a current flow between the first plurality of contact pads CP1-CP5 and the third plurality of contact pads CP11-CP15 results in the amplification of the first optical signal OPS1 propagating through the second waveguide arm 210. The first optical signal OPS1 propagating through the second waveguide arm 210 is amplified based on stimulated emissions caused in the second waveguide arm 210 by the current CI. The first through fifteenth contact pads CP1-CP15 enable the amplification of the first optical signal OPS1 in the PIC 108 such that a significant optical gain is obtained.

The PIC 108 of FIG. 2 is flipped and then coupled to (i.e., bonded to) the silicon photonic device 100. The first through fifteenth contact pads CP1-CP15 assist in the coupling of the PIC 108 to the silicon photonic device 100. For example, to couple the PIC 108 on the silicon photonic device 100, the p-type and n-type contact pads of the PIC 108 are coupled to (i.e., bonded to) p-type and n-type contact pads (not shown) on the silicon photonic device 100, respectively.

Although FIG. 1 illustrates that each of the first plurality of contact pads CP1-CP5, the second plurality of contact pads CP6-CP10, and the third plurality of contact pads CP11-CP15 includes five contact pads, it will be apparent to a person skilled in the art that the scope of the present disclosure is not so limited. Accordingly, in various other embodiments, each of the first plurality of contact pads CP1-CP5, the second plurality of contact pads CP6-CP10, and the third plurality of contact pads CP11-CP15 can include less than or more than five contact pads, without deviating from the scope of the present disclosure.

The PIC 108 further includes first and second metal layers 214 and 216 and a first contact layer 218. The third waveguide 206 is formed below the first metal layer 214. The first plurality of contact pads CP1-CP5 are formed on the first metal layer 214. The first metal layer 214 is a p-type metal layer. Hence, the first plurality of contact pads CP1-CP5 are p-type contact pads. Further, the second and third pluralities of contact pads CP6-CP10 and CP11-CP15 are formed on the second metal layer 216. The second metal layer 216 is an n-type metal layer. Hence, the second and third pluralities of contact pads CP6-CP10 and CP11-CP15 are n-type contact pads. The first contact layer 218 enables the propagation of the current CI between the p-type contact pads (i.e., the first plurality of contact pads CP1-CP5) and the n-type contact pads (i.e., the second and third pluralities of contact pads CP6-CP10 and CP11-CP15). The first contact layer 218 is an n-type contact layer.

The PIC 108 further includes an anti-reflection (AR) coating 220 that is formed on the facet 205 of the PIC 108 where the first and second MFAs 202 and 204 are formed. The AR coating 220 is formed to regulate (i.e., reduce) the optical reflection associated with the first and second optical signals OPS1 and OPS2.

The PIC 108 further includes first through seventh markers MR1-MR7 to align the PIC 108 on the silicon photonic device 100. The first through seventh markers MR1-MR7 are collectively referred to as a "set of markers MR1-MR7". The first through fourth markers MR1-MR4 correspond to Z-stops that are formed on four corners of the PIC 108 to hold the PIC 108 on the silicon photonic device 100. The fifth and sixth markers MR5 and MR6 correspond to fiducial markers and the seventh marker MR7 corresponds to an alignment marker. The fifth through seventh markers MR5-MR7 are indicative of locations of the first and second MFAs 202 and 204 (i.e., the input and output ports) of the PIC 108.

When the PIC 108 is aligned on the silicon photonic device 100, a bonding process is executed to bond the PIC 108 and the silicon photonic device 100. The bonding process includes passing solder on the silicon photonic device 100. The PIC 108 can further include a quick response (QR)-code (not shown) formed on a top surface of the PIC 108 when the PIC 108 is flipped and bonded to the silicon photonic device 100. The QR-code enables identification of the PIC 108 after the PIC 108 is bonded to the silicon photonic device 100. The PIC 108 can further include an auxiliary set of alignment markers (not shown) formed on the top surface of the PIC 108 to provide top-bottom alignment correlation to the set of markers MR1-MR7.

Although FIG. 2 illustrates that the PIC 108 includes one waveguide (i.e., the third waveguide 206), it will be apparent to a person skilled in the art that the scope of the present disclosure is not limited to it. In various other embodiments, the PIC 108 can include more than one waveguide, without deviating from the scope of the present disclosure. In such a scenario, each additional waveguide can be formed in a similar manner as that of the third waveguide 206. Further, each additional waveguide can be integrated with one pair of MFAs (such as the first and second MFAs 202 and 204) for establishing optical communication with various waveguides that are external to the PIC 108 (such as the first and second waveguides 102 and 104).

Figure 3A:
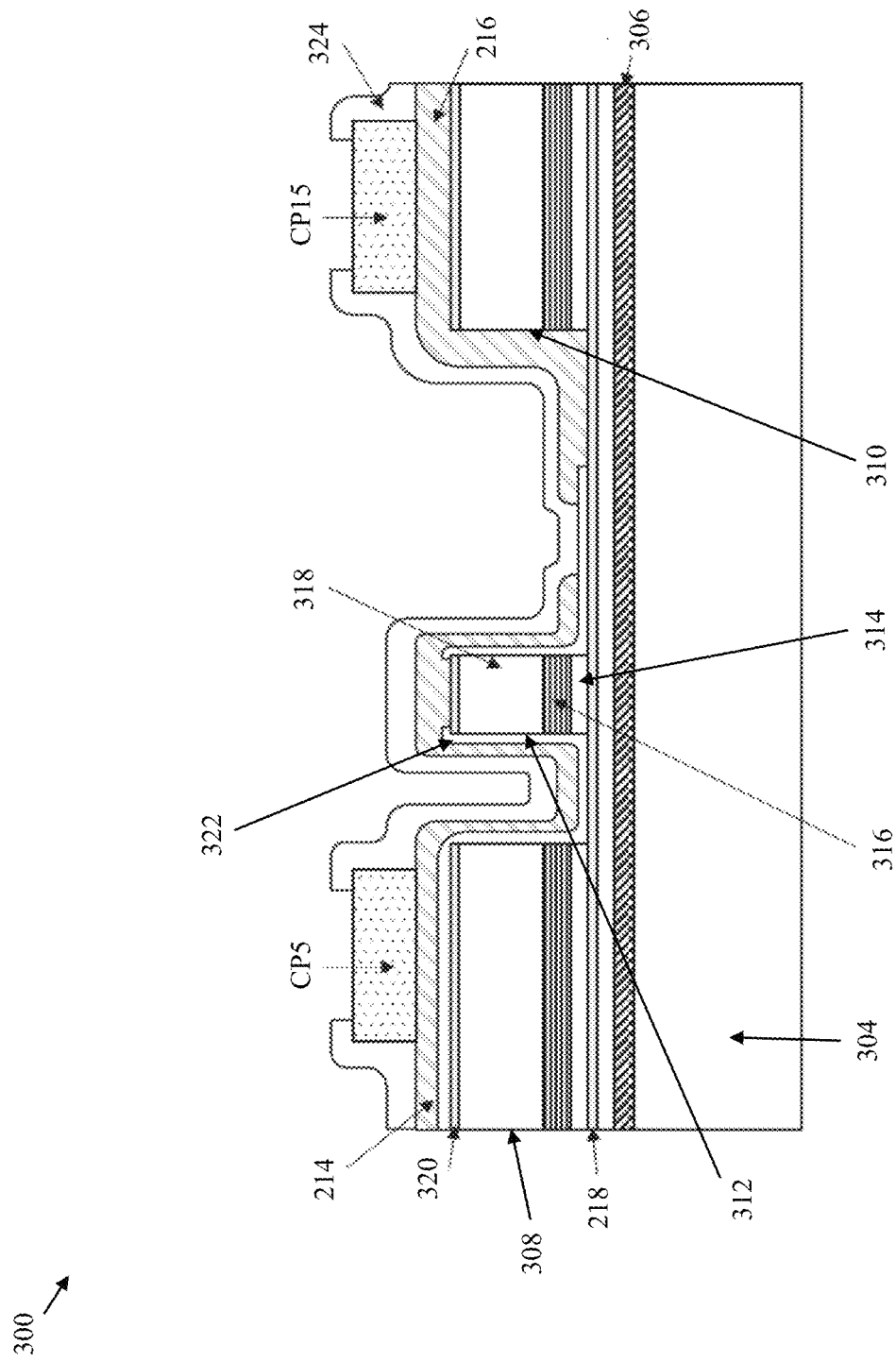
FIG. 3A is a schematic diagram that illustrates a first cross-sectional view of the PIC of the silicon photonic device of FIG. 1, in accordance with an exemplary embodiment of the present disclosure.
Figure 3B:
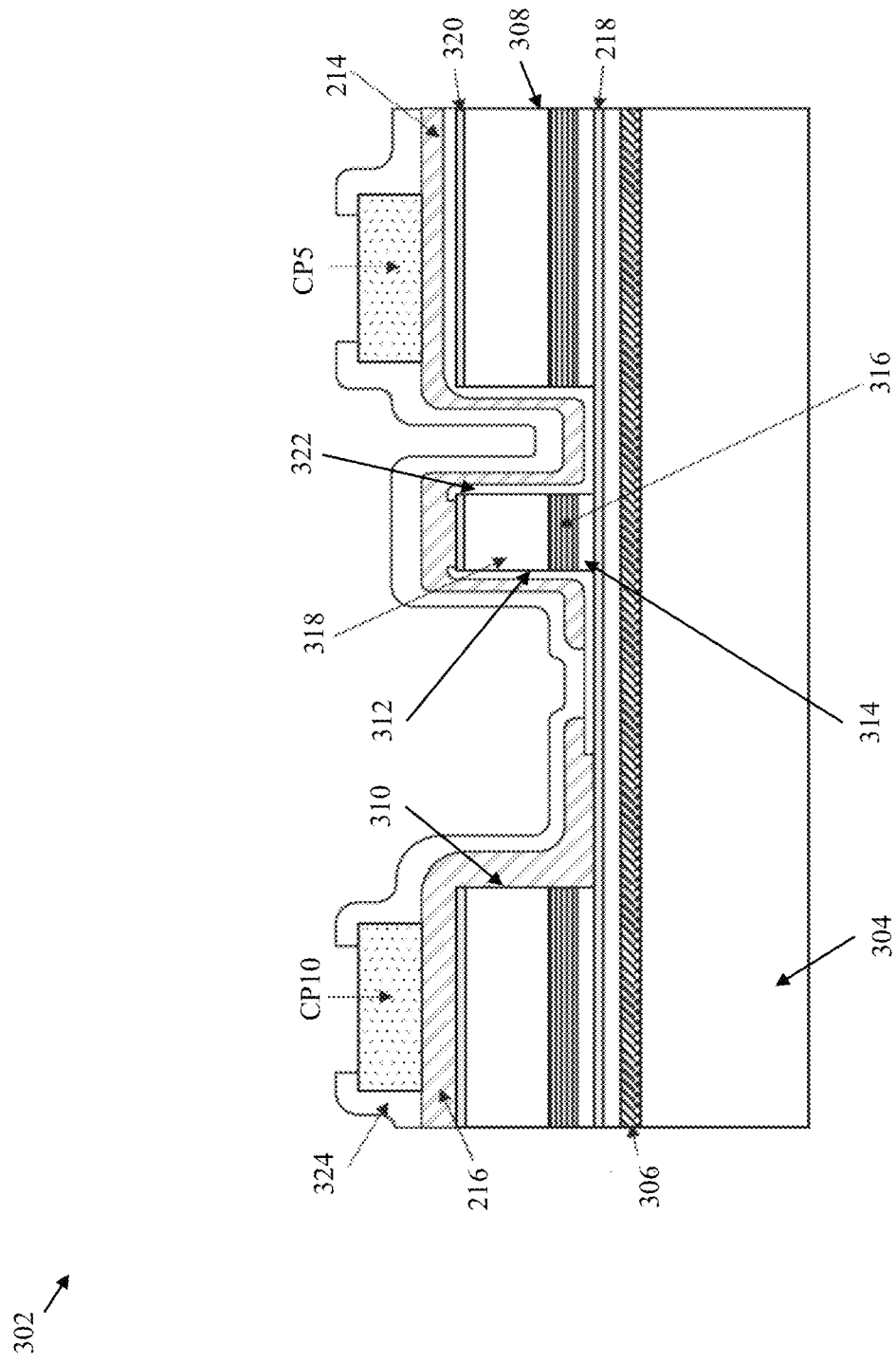
FIG. 3B is a schematic diagram that illustrates a second cross-sectional view of the PIC of the silicon photonic device of FIG. 1, in accordance with an exemplary embodiment of the present disclosure.

FIG. 3A is a schematic diagram that illustrates a first cross-sectional view of the PIC of the silicon photonic device of FIG. 1, in accordance with an exemplary embodiment of the present disclosure. Referring to FIG. 3A, there is shown a first cross-sectional view 300 of the PIC 108. The first cross-sectional view 300 corresponds to a view of a cross-section across A-A' axis shown in FIG. 2. FIG. 3B is a schematic diagram that illustrates a second cross-sectional view of the PIC of the silicon photonic device of FIG. 1, in accordance with an exemplary embodiment of the present disclosure. Referring to FIG. 3B, there is shown a second cross-sectional view 302 of the PIC 108. The second cross-sectional view 302 corresponds to a view of a cross-section across C-C' axis shown in FIG. 2. FIG. 3A has been explained in conjunction with FIG. 3B.

The PIC 108 includes a substrate 304. The substrate 304 is composed of a semi-insulating material. The first contact layer 218 is formed above the substrate 304 such that a fourth waveguide 306 associated with the first and second MFAs 202 and 204 is formed between the first contact layer 218 and the substrate 304. The PIC 108 further includes a first waveguide structure 308, a second waveguide structure 310, and a third waveguide structure 312 that are formed on the first contact layer 218. Each waveguide structure of the first waveguide structure 308, the second waveguide structure 310, and the third waveguide structure 312 includes a first clad layer 314, an active waveguide core 316 formed on the first clad layer 314, and a second clad layer 318 formed on the active waveguide core 316. The first and second clad layers 314 and 318 are n-type and p-type clad layers, respectively. Further, the active waveguide core 316 can correspond to a quantum well structure or a bulk waveguide layer formed between separate confinement heterostructure (SCH) layers.

The first plurality of contact pads CP1-CP5 are formed above the first waveguide structure 308 and the second and third pluralities of contact pads CP6-CP10 and CP11-CP15 are formed above the second waveguide structure 310. For example, the fifth contact pad CP5 is formed above the first waveguide structure 308 shown in FIGS. 3A and 3B. Similarly, the fifteenth contact pad CP15 is formed above the second waveguide structure 310 shown in FIG. 3A, whereas the tenth contact pad CP10 is formed above the second waveguide structure 310 shown in FIG. 3B.

The third waveguide structure 312 corresponds to the third waveguide 206. More specifically, the third waveguide structure 312 shown in FIGS. 3A and 3B corresponds to the HIC waveguide. The HIC waveguide ensures optical and electrical confinement of the first optical signal OPS1 within the third waveguide structure 312, thereby reducing optical reflection at the bend portion 212 and increasing the optical gain associated with the PIC 108. The third waveguide structure 312 can be formed by performing dry plasma etching beyond the active waveguide core 316. The third waveguide structure 312 has two straight sections that correspond to the first and second waveguide arms 208 and 210, respectively. The third waveguide structure 312 further has a curved section that joins the two straight sections. The curved section of the third waveguide structure 312 thus corresponds to the bend portion 212. The third waveguide structure 312 shown in FIG. 3A corresponds to a portion of the second waveguide arm 210 (i.e., a portion of one straight section), whereas the third waveguide structure 312 shown in FIG. 3B corresponds to a portion of the first waveguide arm 208 (i.e., a portion of another straight section).

The PIC 108 further includes a second contact layer 320 and a first dielectric layer 322. The second contact layer 320 is formed on the first waveguide structure 308, the second waveguide structure 310, and the third waveguide structure 312. The second contact layer 320 is a p-type contact layer. The first dielectric layer 322 is formed on sidewalls of the third waveguide structure 312. The first dielectric layer 322 is further formed on the second contact layer 320 that is associated with the first waveguide structure 308 (i.e., a portion of the second contact layer 320 that is on the first waveguide structure 308). Further, the first dielectric layer 322 is formed in a first region between the first and third waveguide structures 308 and 312, and a second region between the second and third waveguide structures 310 and 312. The first dielectric layer 322 is formed in the first region between the first and third waveguide structures 308 and 312 such that the first dielectric layer 322 covers the entire first region. Conversely, the first dielectric layer 322 is formed in the second region between the second and third waveguide structures 310 and 312 such that the first dielectric layer 322 covers a portion of the second region. The first dielectric layer 322 is utilized for passivation and can be composed of silicon dioxide (SiO2), silicon oxynitride (SiON), silicon nitride ($Si_3N_4$), polyimide, or the like. The thickness of the first dielectric layer 322 can be approximately equal to 100 nanometers. The first dielectric layer 322 further assists in dissipation of heat generated in the third waveguide structure 312 (i.e., the active waveguide core 316).

The first metal layer 214 is formed on the first dielectric layer 322. The first metal layer 214 is further formed on the second contact layer 320 which is associated with the third waveguide structure 312 (i.e., a portion of the second contact layer 320 that is on the third waveguide structure 312). Each contact pad of the first plurality of contact pads CP1-CP5 is formed on a portion of the first metal layer 214 that is above the first waveguide structure 308. For example, the fifth contact pad CP5 is formed on a portion of the first metal layer 214 that is above the first waveguide structure 308 shown in FIGS. 3A and 3B. The first metal layer 214 assists in dissipation of the heat generated in the third waveguide structure 312 (i.e., the active waveguide core 316).

The second metal layer 216 is formed on the second contact layer 320 that is associated with the second waveguide structure 310 (i.e., a portion of the second contact layer 320 that is on the second waveguide structure 310). Each contact pad of the second and third pluralities of contact pads CP6-CP10 and CP11-CP15 is formed on a portion of the second metal layer 216 that is above the second waveguide structure 310. For example, the fifteenth and tenth contact pads CP15 and CP10 are formed on portions of the second metal layer 216 that are above the second waveguide structure 310 shown in FIGS. 3A and 3B, respectively. The second metal layer 216 is in contact with the first contact layer 218 for electrical connectivity. The second metal layer 216 is further formed in the second region between the second and third waveguide structures 310 and 312 such that the second metal layer 216 overlaps with the first dielectric layer 322. The first dielectric layer 322 thus enables thermal contact between the first and second metal layers 214 and 216. As a result, the heat generated in the first contact layer 218 can be dissipated to the silicon photonic device 100 by way of the first and second metal layers 214 and 216 and the first through fifteenth contact pads CP1-CP15 when the PIC 108 is bonded to the silicon photonic device 100. The second metal layer 216 further assists in dissipation of the heat generated in the third waveguide structure 312 (i.e., the active waveguide core 316). Further, the second metal layer 216 formed on both sides of the first metal layer 214 minimizes electrical path, and in turn, electrical resistance between the first and second metal layers 214 and 216, thereby reducing heat generation in the PIC 108.

The first through fifteenth contact pads CP1-CP15 and the third waveguide structure 312 are formed such that when the PIC 108 is flipped and bonded to the silicon photonic device 100, the third waveguide 206 is recessed (i.e., is not in physical contact with the silicon photonic device 100). This protects the third waveguide 206 from the stress imposed by the solder during the bonding process and coefficient-of-thermal-expansion induced stress when the solder cools down.

The PIC 108 further includes a second dielectric layer 324 that is formed on the first and second metal layers 214 and 216 for passivation. The second dielectric layer 324 is formed such that the first plurality of contact pads CP1-CP5, the second plurality of contact pads CP6-CP10, and the third plurality of contact pads CP11-CP15 are uncovered by the second dielectric layer 324. In other words, the entire surface of the PIC 108, barring the first through third pluralities of contact pads CP1-CP5, CP6-CP10, and CP11-CP15, is covered by the second dielectric layer 324. The second dielectric layer 324 acts as a solder dam to control the solder flow during the bonding process between the PIC 108 and silicon photonic device 100. Additionally, the second dielectric layer 324 provides passivation of the PIC 108 for operations in a non-hermetic environment.

Figure 4:
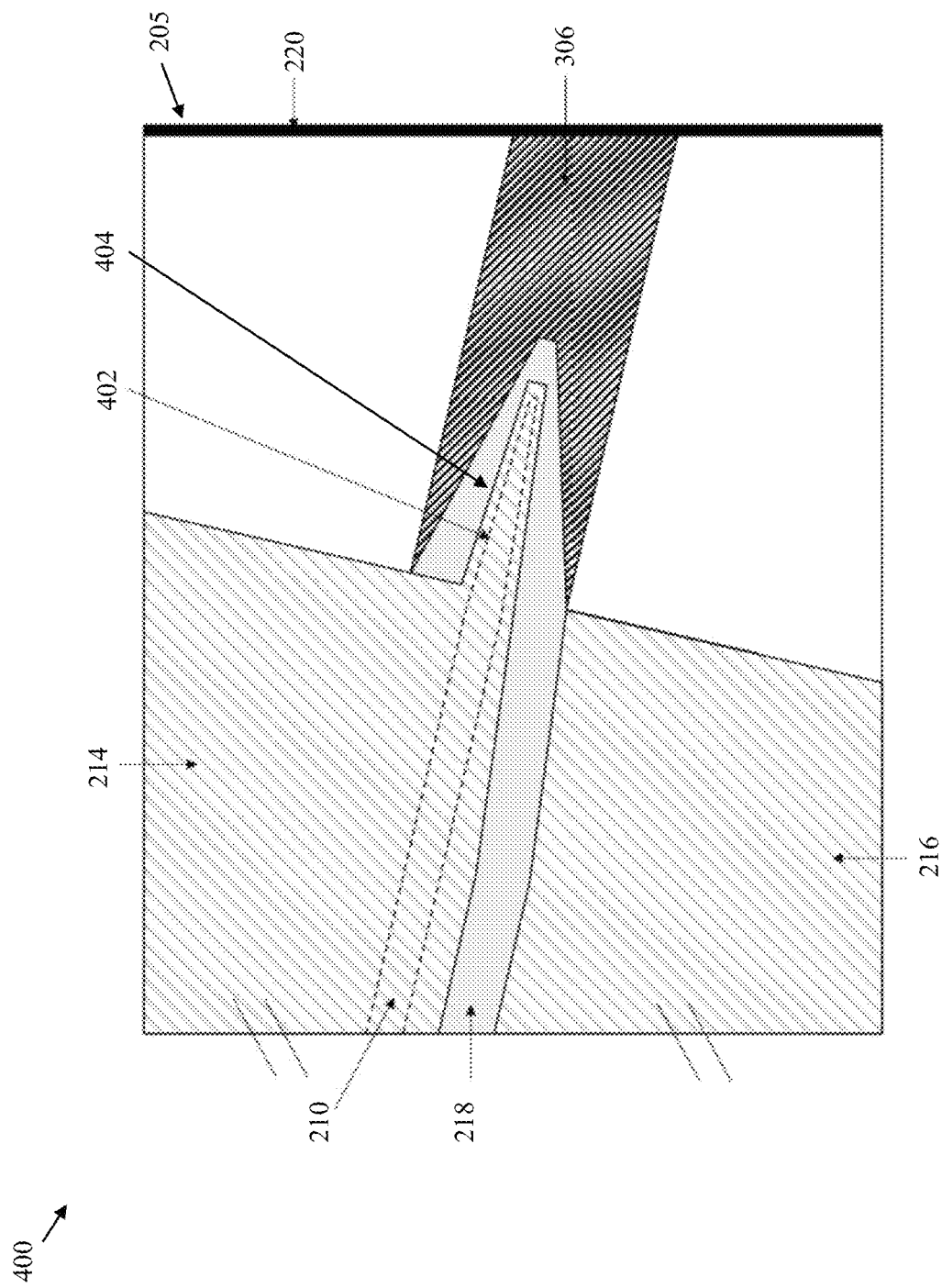
FIG. 4 is a schematic diagram that illustrates a top view of integration of a mode field adapter (MFA) of the PIC of the silicon photonic device of FIG. 1 with a waveguide of the PIC of the silicon photonic device of FIG. 1, in accordance with an exemplary embodiment of the present disclosure.

FIG. 4 is a schematic diagram that illustrates a top view of integration of an MFA of the PIC of the silicon photonic device of FIG. 1 with a waveguide of the PIC of the silicon photonic device of FIG. 1, in accordance with an exemplary embodiment of the present disclosure. Referring to FIG. 4, there is shown a top view 400 of the integration of the second MFA 204 of the PIC 108 with the third waveguide 206 of the PIC 108.

The second waveguide arm 210 of the third waveguide 206 is formed between the first metal layer 214 and the first contact layer 218. The first contact layer 218 is in contact with the second metal layer 216. Further, the facet 205 of the PIC 108 is coated with the AR coating 220 to regulate the optical reflection associated with the first and second optical signals OPS1 and OPS2.

The second MFA 204 includes the fourth waveguide 306 that is coupled to the second waveguide 104, and a tapered active waveguide core 402. The fourth waveguide 306 is a transparent waveguide (i.e., is undoped). The tapered active waveguide core 402 extends between the fourth waveguide 306 and the third waveguide 206. The tapered active waveguide core 402 is an extension of the active waveguide core 316 included in the third waveguide structure 312. Further, the tapered active waveguide core 402 is formed on a tapered contact layer 404 of the second MFA 204. The tapered contact layer 404 is an extension of the first contact layer 218. The tapered active waveguide core 402 enables propagation of the second optical signal OPS2 from the second waveguide arm 210 to the fourth waveguide 306. The fourth waveguide 306 is then configured to provide the second optical signal OPS2 to the second waveguide 104. The second MFA 204 thus provides optical coupling between the second waveguide 104 and the second waveguide arm 210 of the third waveguide 206. Further, the second MFA 204 reduces the optical mode far-field divergence associated therewith to a 20° full width at half maximum (FWHM) circular profile to match with that of the second waveguide 104 for enhancing optical coupling efficiency.

Figure 5:
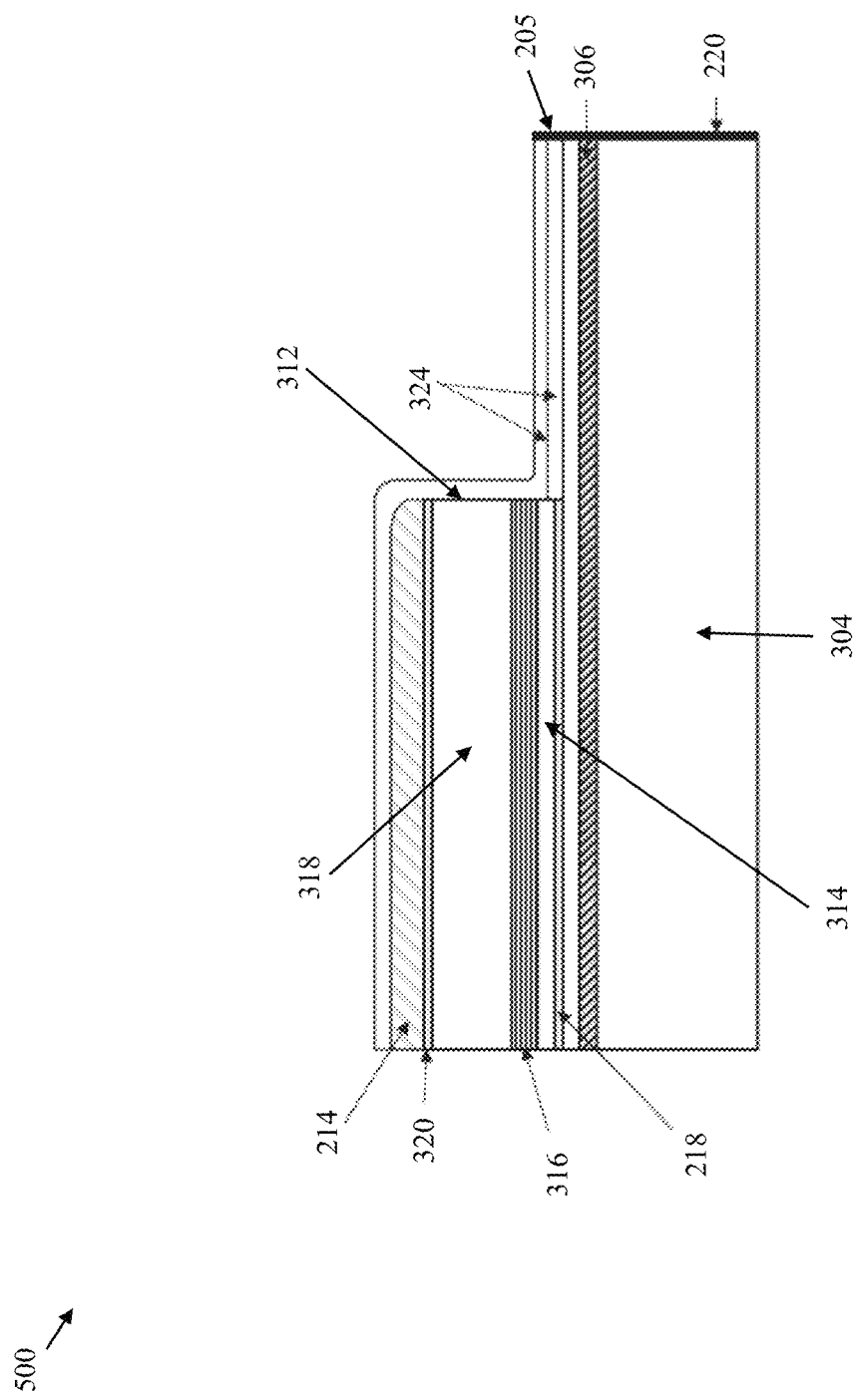
FIG. 5 is a schematic diagram that illustrates a cross-sectional view of the integration of the MFA of the PIC of the silicon photonic device of FIG. 1 with the waveguide of the PIC of the silicon photonic device of FIG. 1, in accordance with an exemplary embodiment of the present disclosure.

FIG. 5 is a schematic diagram that illustrates a cross-sectional view of the integration of the MFA of the PIC of the silicon photonic device of FIG. 1 with the waveguide of the PIC of the silicon photonic device of FIG. 1, in accordance with an exemplary embodiment of the present disclosure. Referring to FIG. 5, there is shown a cross-sectional view 500 of the integration of the second MFA 204 of the PIC 108 with the third waveguide 206 of the PIC 108.

The third waveguide structure 312 is formed on the first contact layer 218. The fourth waveguide 306 is formed between the substrate 304 and the first contact layer 218. The second contact layer 320 is formed on the third waveguide structure 312 whereas the first metal layer 214 is formed on the second contact layer 320. Further, the second dielectric layer 324 is formed on the first metal layer 214 and in a region adjacent to the third waveguide structure 312. The second optical signal OPS2 propagates from the second waveguide arm 210 (i.e., the active waveguide core 316) to the fourth waveguide 306 by way of the tapered active waveguide core 402. The fourth waveguide 306 further provides the second optical signal OPS2 to the second waveguide 104. In the cross-sectional view illustrated in FIG. 5, the tapered active waveguide core 402 is not shown. However, it will be apparent to a person skilled in the art that the tapered active waveguide core 402 extends between the active waveguide core 316 of the third waveguide structure 312 and the fourth waveguide 306. Further, the AR coating 220 is formed on the facet 205.

It will be apparent to a person skilled in the art that the first MFA 202 can be structurally similar to the second MFA 204 described above in FIGS. 4 and 5. The fourth waveguide 306 associated with the first MFA 202 receives the first optical signal OPS1 from the first waveguide 102. Further, the tapered active waveguide core 402 associated with the first MFA 202 enables propagation of the first optical signal OPS1 from the fourth waveguide 306 to the first waveguide arm 208.

Figure 6:
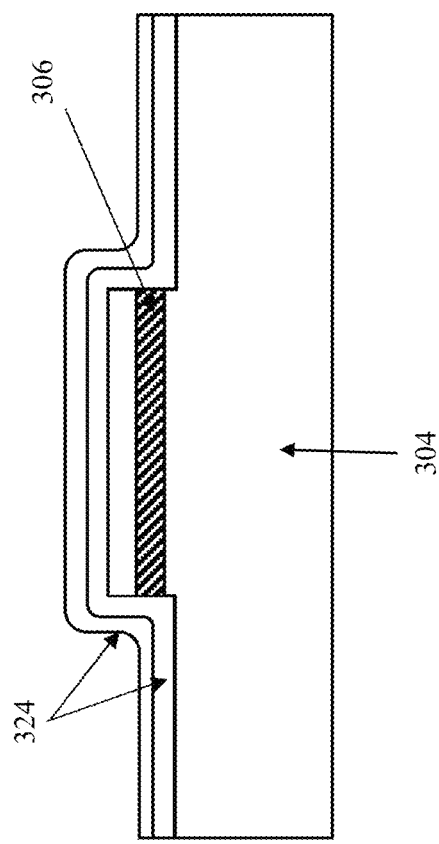
FIG. 6 is a schematic diagram that illustrates a third cross-sectional view of the PIC of the silicon photonic device of FIG. 1, in accordance with an exemplary embodiment of the present disclosure.

FIG. 6 is a schematic diagram that illustrates a third cross-sectional view of the PIC of the silicon photonic device of FIG. 1, in accordance with an exemplary embodiment of the present disclosure. Referring to FIG. 6, there is shown a third cross-sectional view 600 of the PIC 108. The third cross-sectional view 600 corresponds to a view of cross-section across B-B' axis shown in FIG. 2. As illustrated in FIG. 6, the fourth waveguide 306 is formed on the substrate 304, and is covered by the second dielectric layer 324. The fourth waveguide 306 has the optical mode far-field divergence that matches with the first waveguide 102. The first and second MFAs 202 and 204 are formed by post-growth waveguide etching without any need for regrowth.

Figure 7:
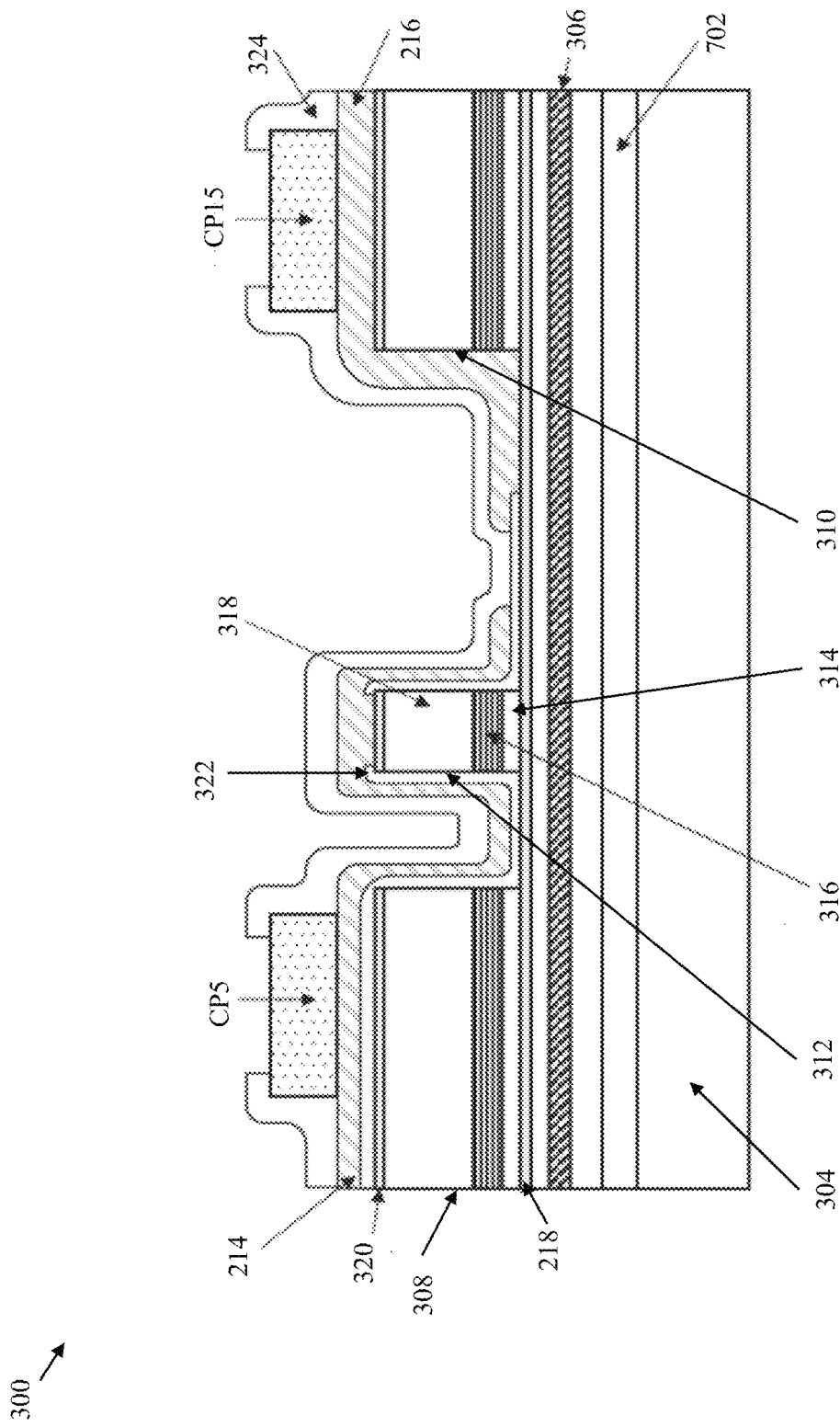
FIG. 7 is a schematic diagram that illustrates the first cross-sectional view of the PIC of the silicon photonic device of FIG. 1, in accordance with another exemplary embodiment of the present disclosure.

FIG. 7 is a schematic diagram that illustrates the first cross-sectional view of the PIC of the silicon photonic device of FIG. 1, in accordance with another exemplary embodiment of the present disclosure. Referring to FIG. 7, there is shown the first cross-sectional view 300 of the PIC 108. The first cross-sectional view 300 corresponds to a view of cross-section across the A-A' axis shown in FIG. 2.

The PIC 108 includes the substrate 304, the first through third waveguide structures 308-312, and the first and second contact layers 218 and 320 that remain same as described in FIG. 3A. The PIC 108 further includes the first and second metal layers 214 and 216, the first and second dielectric layers 322 and 324, and the first through fifteenth contact pads CP1-CP15 that remain same as described in FIG. 3A. The difference between the PIC 108 of FIG. 3A and the PIC 108 of FIG. 7 is that in the PIC 108 of FIG. 7, the second MFA 204 further includes a fifth waveguide 702 that is formed below the fourth waveguide 306. In such a scenario, the fourth waveguide 306 outputs and provides the second optical signal OPS2 to the second waveguide 104 by way of the fifth waveguide 702. It will be apparent to a person skilled in the art that the first MFA 202 can similarly include the fifth waveguide 702 below the fourth waveguide 306. In such a scenario, the fourth waveguide 306 receives the first optical signal OPS1 from the first waveguide 102 by way of the fifth waveguide 702. The first and second waveguides 102 and 104 in such a PIC 108 can correspond to optical fibers. The presence of the fifth waveguide 702 below the fourth waveguide 306 results in the reduction of the optical mode far-field divergence to approximately 10°.

Figure 8:
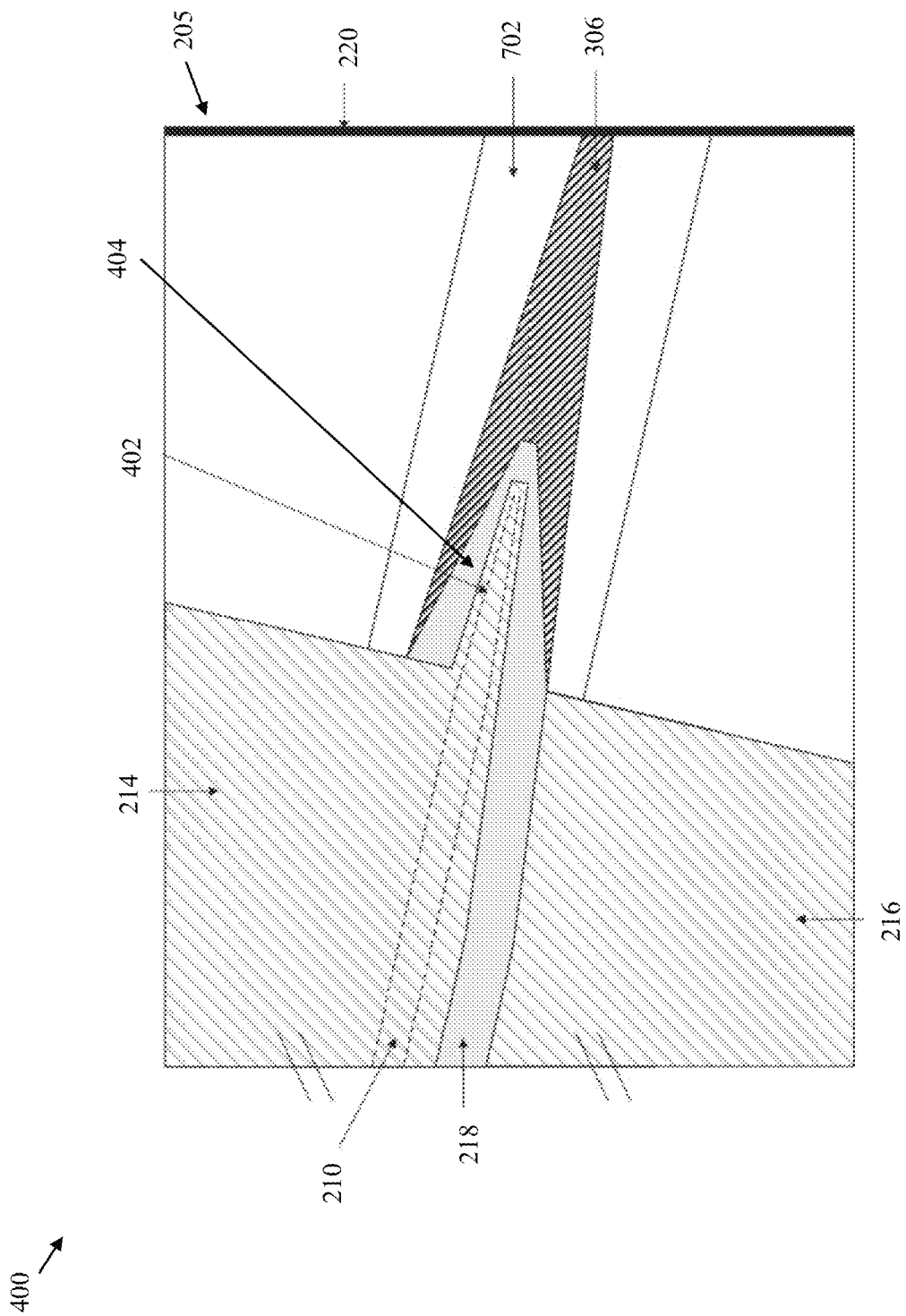
FIG. 8 is a schematic diagram that illustrates a top view of the integration of the MFA of the PIC of the silicon photonic device of FIG. 1 with the waveguide of the PIC of the silicon photonic device of FIG. 1, in accordance with another exemplary embodiment of the present disclosure.

FIG. 8 is a schematic diagram that illustrates the top view of the integration of the MFA of the PIC of the silicon photonic device of FIG. 1 with the waveguide of the PIC of the silicon photonic device of FIG. 1, in accordance with another exemplary embodiment of the present disclosure. Referring to FIG. 8, there is shown the top view 400 of the integration of the second MFA 204 with the third waveguide 206.

The second waveguide arm 210 of the third waveguide 206 is formed between the first metal layer 214 and the first contact layer 218. The first contact layer 218 is in contact with the second metal layer 216. Further, the facet 205 of the PIC 108 is coated with the AR coating 220 to regulate the optical reflection associated with the first and second optical signals OPS1 and OPS2.

The second MFA 204 includes the fourth waveguide 306, the tapered active waveguide core 402, the tapered contact layer 404, and the fifth waveguide 702. The fourth waveguide 306, the tapered active waveguide core 402, and the tapered contact layer 404 remain same as described in FIG. 4. The fifth waveguide 702 is formed below the fourth waveguide 306. The presence of an additional waveguide (i.e., the fifth waveguide 702) improves the optical coupling efficiency between the third waveguide 206 and the second waveguide 104. It will be apparent to a person skilled in the art that the first MFA 202 can be structurally similar to the second MFA 204 described above in FIG. 8.

Figure 9:
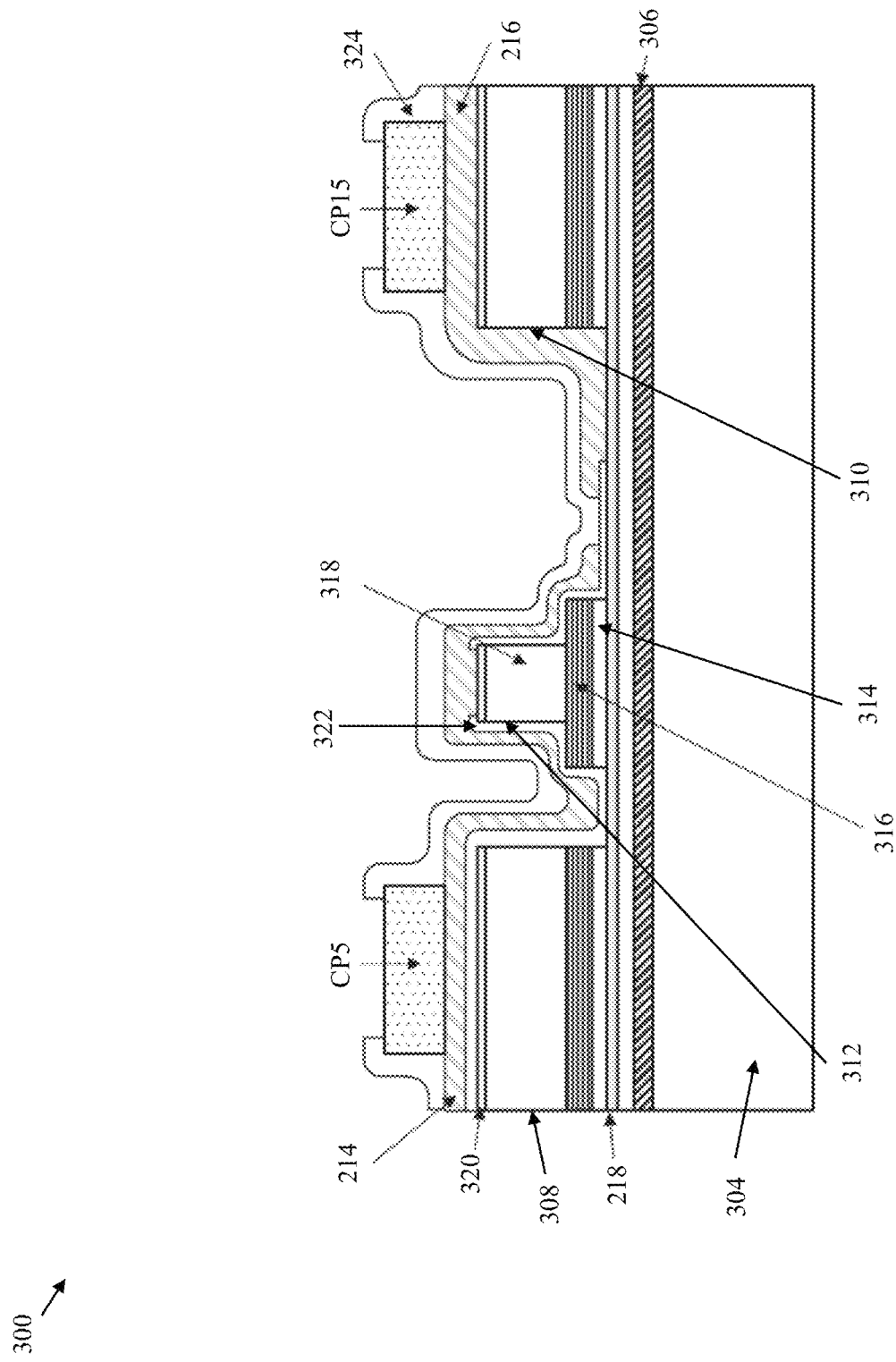
FIG. 9 is a schematic diagram that illustrates the first cross-sectional view of the PIC of the silicon photonic device of FIG. 1, in accordance with yet another exemplary embodiment of the present disclosure.

FIG. 9 is a schematic diagram that illustrates the first cross-sectional view of the PIC of the silicon photonic device of FIG. 1, in accordance with yet another exemplary embodiment of the present disclosure. Referring to FIG. 9, there is shown the first cross-sectional view 300 of the PIC 108. The first cross-sectional view 300 corresponds to a view of cross-section across the A-A' axis shown in FIG. 2.

The PIC 108 includes the substrate 304, the first through third waveguide structures 308-312, the first and second contact layers 218 and 320, the first and second metal layers 214 and 216, the first and second dielectric layers 322 and 324, and the first through fifteenth contact pads CP1-CP15. The substrate 304, the first and second waveguide structures 308 and 310, the first and second contact layers 218 and 320, the first and second metal layers 214 and 216, the first and second dielectric layers 322 and 324, and the first through fifteenth contact pads CP1-CP15 remain same as described in FIG. 3A.

The difference between the PIC 108 of FIG. 3A and the PIC 108 of FIG. 9 is that in the PIC 108 of FIG. 9, the third waveguide structure 312 corresponds to the MIC waveguide as opposed to the HIC waveguide in the PIC 108 of FIG. 3A. In such a scenario, the dry plasma etching is performed over a smaller depth as compared to the third waveguide structure 312 of FIG. 3A (i.e., the dry plasma etching is stopped above the active waveguide core 316). The subsequent etch through the active waveguide core 316 is carried out over a wider width.

Figure 10:
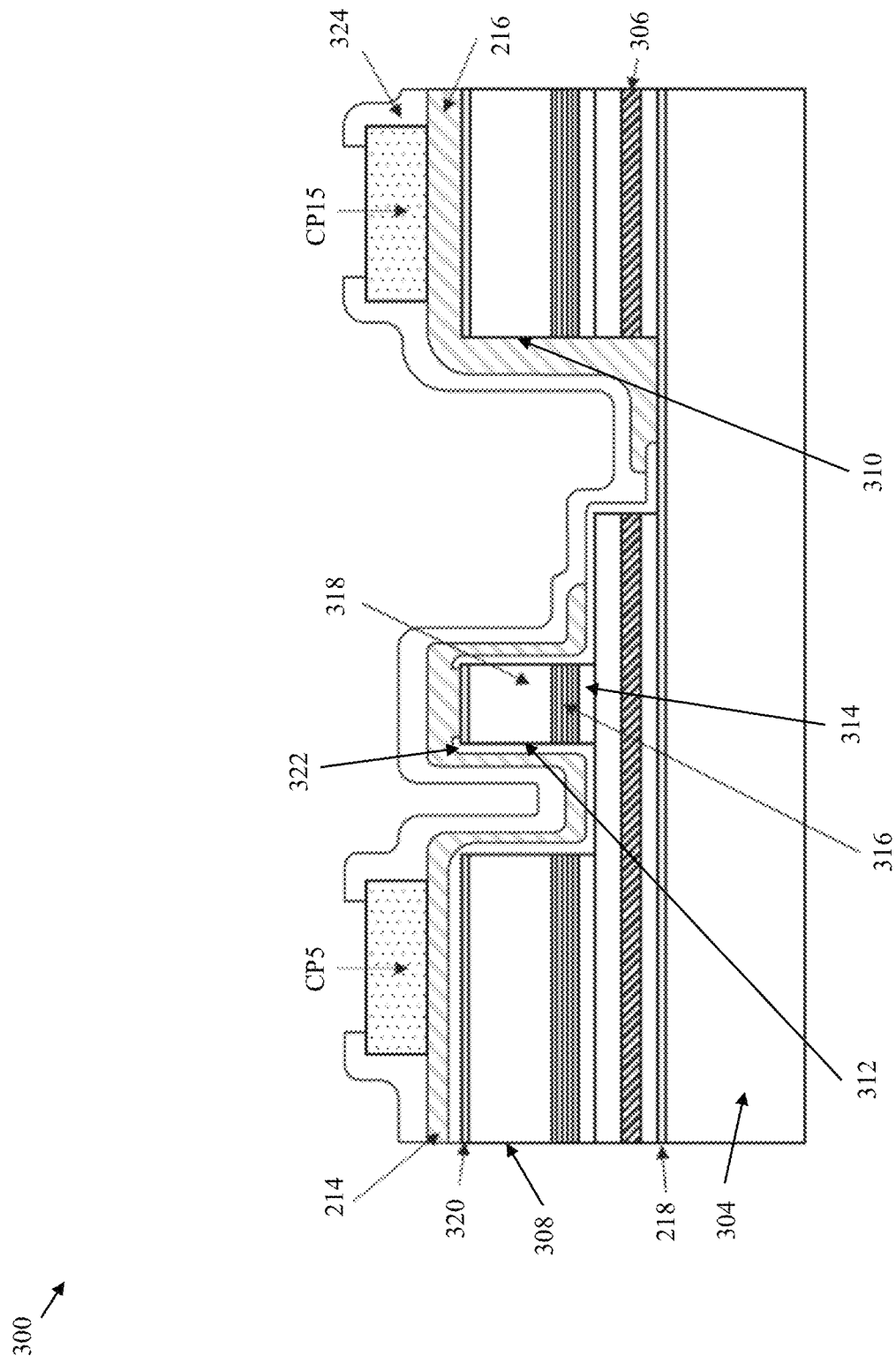
FIG. 10 is a schematic diagram that illustrates the first cross-sectional view of the PIC of the silicon photonic device of FIG. 1, in accordance with yet another exemplary embodiment of the present disclosure.

FIG. 10 is a schematic diagram that illustrates the first cross-sectional view of the PIC of the silicon photonic device of FIG. 1, in accordance with yet another exemplary embodiment of the present disclosure. Referring to FIG. 10, there is shown the first cross-sectional view 300 of the PIC 108. The first cross-sectional view 300 corresponds to a view of cross-section across the A-A' axis shown in FIG. 2.

The PIC 108 includes the substrate 304, the first through third waveguide structures 308-312, the first and second contact layers 218 and 320, the first and second metal layers 214 and 216, the first and second dielectric layers 322 and 324, and the first through fifteenth contact pads CP1-CP15. The substrate 304, the first through third waveguide structures 308-312, the second contact layer 320, the first and second metal layers 214 and 216, the first and second dielectric layers 322 and 324, and the first through fifteenth contact pads CP1-CP15 remain same as described in FIG. 3A.

The difference between the PIC 108 of FIG. 3A and the PIC 108 of FIG. 10 is that in the PIC 108 of FIG. 10, the first contact layer 218 is formed on the substrate 304 as opposed to between the substrate 304 and the fourth waveguide 306 in the PIC 108 of FIG. 3A. In such a scenario, the fourth waveguide 306 is formed between the first contact layer 218 and the first through third waveguide structures 308-312. Further, in the PIC 108 of FIG. 10, the fourth waveguide 306 is not continuous and a region is created in the fourth waveguide 306 to enable contact between the second metal layer 216 and the first contact layer 218. The current CI thus propagates from the fifth contact pad CP5 to the fifteenth contact pad CP15 via the first metal layer 214, the second contact layer 320, the second clad layer 318, the active waveguide core 316, the first clad layer 314, the fourth waveguide 306, the first contact layer 218, and the second metal layer 216.

Figure 11:
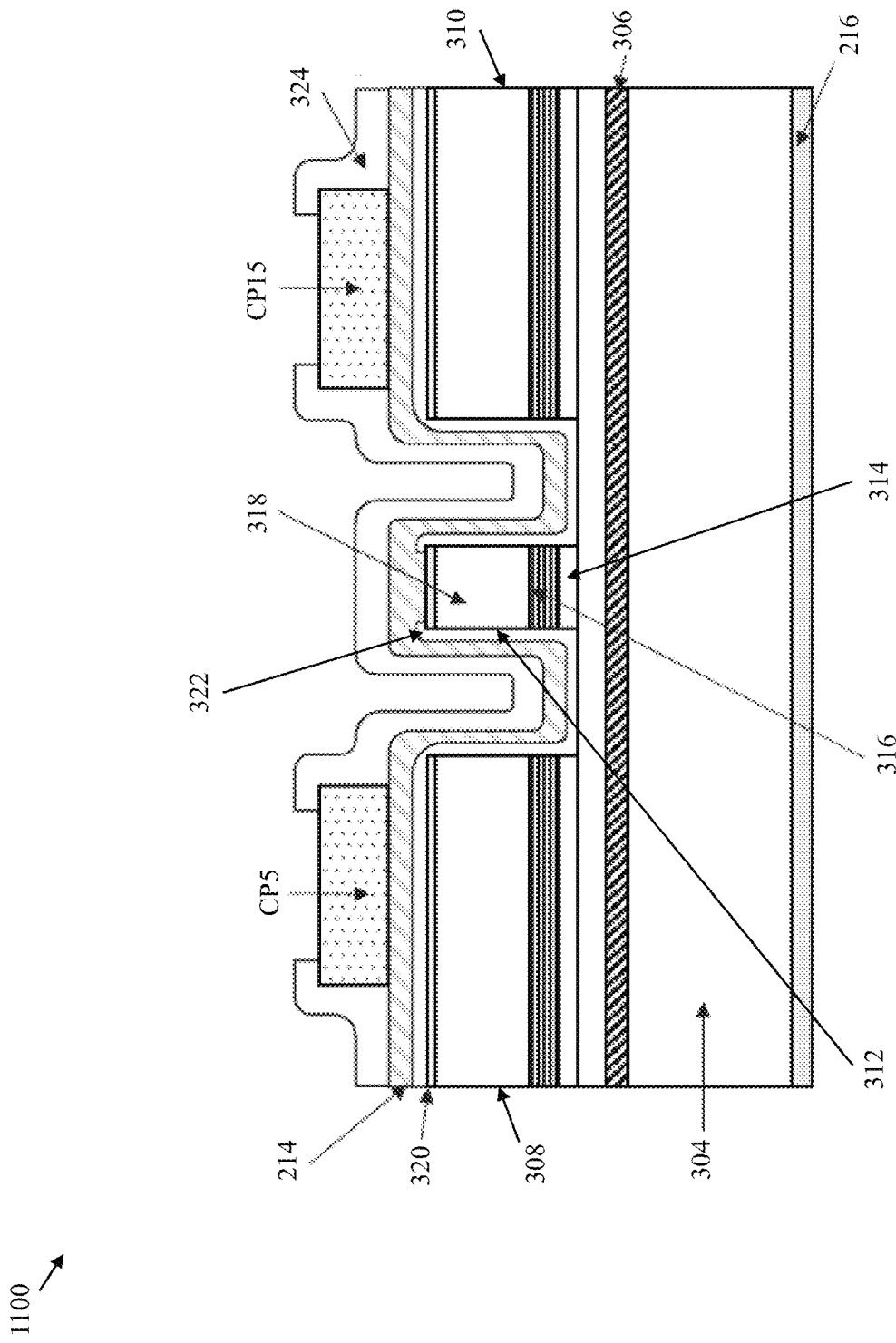
FIG. 11 is a schematic diagram that illustrates a fourth cross-sectional view of the PIC of the silicon photonic device of FIG. 1, in accordance with an exemplary embodiment of the present disclosure.

FIG. 11 is a schematic diagram that illustrates a fourth cross-sectional view of the PIC of the silicon photonic device of FIG. 1, in accordance with an exemplary embodiment of the present disclosure. Referring to FIG. 11, there is shown a fourth cross-sectional view 1100 of the PIC 108 that has a non-flip-chip assembly. In other words, the PIC 108 is not flipped prior to bonding to the silicon photonic device 100. Such a PIC 108 includes the substrate 304, the first waveguide structure 308, the second waveguide structure 310, and the third waveguide structure 312, the second contact layer 320, the first and second metal layers 214 and 216, the first and second dielectric layers 322 and 324, and the first through fifteenth contact pads CP1-CP15. The first contact layer 218 is absent in the PIC 108 of FIG. 11. It will be apparent to a person skilled in the art that a top view of such a PIC 108 is different (i.e., the first contact layer 218 is absent) than that illustrated in FIG. 2.

Each of the first through fifteenth contact pads CP1-CP15 corresponds to a p-type contact pad. Further, the PIC 108 is coupled to the silicon photonic device 100 by way of the first through fifteenth contact pads CP1-CP15 and the second metal layer 216. The second metal layer 216 is bonded to the silicon photonic device 100 by way of the solder, whereas the first through fifteenth contact pads CP1-CP15 are bonded to the silicon photonic device 100 by way of bonding wires (not shown).

The substrate 304 is formed on the second metal layer 216. In the PIC 108 of FIG. 11, the substrate 304 is an n-type substrate. Further, the first waveguide structure 308, the second waveguide structure 310, and the third waveguide structure 312 are formed above the substrate 304. The first waveguide structure 308, the second waveguide structure 310, and the third waveguide structure 312 remain same as described in FIGS. 3A and 3B. The fourth waveguide 306 is formed between the substrate 304 and the first through third waveguide structures 308-312. The second contact layer 320 is formed on the first waveguide structure 308, the second waveguide structure 310, and the third waveguide structure 312 in a similar manner as described in FIGS. 3A and 3B.

The first dielectric layer 322 is formed on the sidewalls of the third waveguide structure 312, and on the second contact layer 320 that is associated with the first waveguide structure 308 in a similar manner as described in FIGS. 3A and 3B. Additionally, in the PIC 108 of FIG. 11, the first dielectric layer 322 is formed on the second contact layer 320 that is associated with the second waveguide structure 310. The first dielectric layer 322 is further formed in the first region between the first and third waveguide structures 308 and 312, and the second region between the second and third waveguide structures 310 and 312. The first dielectric layer 322 is formed in the first and second regions such that the first and second regions are covered by the first dielectric layer 322 in entirety.

The first metal layer 214 is then formed on the first dielectric layer 322 and the second contact layer 320 that is associated with the third waveguide structure 312. Each contact pad of the first plurality of contact pads CP1-CP5 is formed on a portion of the first metal layer 214 that is above the first waveguide structure 308. Further, each contact pad of the second and third pluralities of contact pads CP6-CP10 and CP11-CP15 is formed on a portion of the first metal layer 214 that is above the second waveguide structure 310. The second dielectric layer 324 is formed on the first metal layer 214 for passivation. The second dielectric layer 324 is formed such that the first through third pluralities of contact pads CP1-CP5, CP6-CP10, and CP11-CP15 are uncovered by the second dielectric layer 324.

FIG. 12 is a schematic diagram that illustrates the top view of the PIC of the silicon photonic device of FIG. 1, in accordance with another exemplary embodiment of the present disclosure. Referring to FIG. 12, there is shown the top view 200 of the PIC 108 that corresponds to the gain chip.

The PIC 108 of FIG. 12 includes the first and second MFAs 202 and 204 on the facet 205 of the PIC 108, the third waveguide 206, and the first through third pluralities of contact pads CP1-CP5, CP6-CP10, and CP11-CP15. The first MFA 202 is configured to receive the first optical signal OPS1 from the first waveguide 102. Further, the first MFA 202 is configured to output and provide the second optical signal OPS2 to the first waveguide 102. The first optical signal OPS1 is amplified based on the current CI injected in the PIC 108. The third waveguide 206 extends between the first and second MFAs 202 and 204 such that the first optical signal OPS1 propagates through the third waveguide 206. The third waveguide 206 is divided into the first and second waveguide arms 208 and 210 and the bend portion 212 that joins the first and second waveguide arms 208 and 210.

In the PIC 108 of FIG. 12, the first through third pluralities of contact pads CP1-CP5, CP6-CP10, and CP11-CP15 are not illustrated. However, it will be apparent to a person skilled in the art that the first waveguide arm 208 is formed between the first plurality of contact pads CP1-CP5 and the second plurality of contact pads CP6-CP10. Similarly, the second waveguide arm 210 is between the first plurality of contact pads CP1-CP5 and the third plurality of contact pads CP11-CP15. The current CI is injected in the PIC 108 by way of the first through third pluralities of contact pads CP1-CP5, CP6-CP10, and CP11-CP15. Further, the PIC 108 of FIG. 12 includes all other layers (e.g., the first and second metal layers 214 and 216 and the first contact layer 218), the AR coating 220, and the set of markers MR1-MR7 that are illustrated and described in FIG. 2, and are not illustrated in FIG. 12 to keep the illustration concise and clear.

The PIC 108 of FIG. 12 further includes a grating 1202 that is formed on the second waveguide arm 210 of the third waveguide 206. The grating 1202 has a reflectivity of more than 90%. Thus, the grating 1202 is configured to reflect the first optical signal OPS1 that propagates through the third waveguide 206 such that the second optical signal OPS2 is outputted by way of the first MFA 202. In other words, the first MFA 202 is configured to receive the second optical signal OPS2 from the first waveguide arm 208, and provide the second optical signal OPS2 to the first waveguide 102. The first optical circuit in such a scenario can correspond to a cavity laser. An interaction length (i.e., a portion of the third waveguide 206 experiencing current injection) of the PIC 108 of FIG. 12 is significantly greater than that of a conventional PIC operating as a gain chip.

FIG. 13 is a schematic diagram that illustrates the top view of the PIC of the silicon photonic device of FIG. 1, in accordance with yet another exemplary embodiment of the present disclosure. Referring to FIG. 13, there is shown the top view 200 of the PIC 108 that corresponds to the combination of the SOA (i.e., the PIC 108 of FIG. 2) and the MMI coupler (hereinafter referred to and designated as the "MMI coupler 1302").

The PIC 108 of FIG. 13 includes the first and second MFAs 202 and 204 on the facet 205 of the PIC 108, the third waveguide 206, and the first through third pluralities of contact pads CP1-CP5, CP6-CP10, and CP11-CP15. The first MFA 202 is configured to receive the first optical signal OPS1 from the first waveguide 102. Further, the second MFA 204 is configured to output and provide the second optical signal OPS2 to the second waveguide 104. The first optical signal OPS1 is amplified based on the current CI injected in the PIC 108. The third waveguide 206 extends between the first and second MFAs 202 and 204 such that the first optical signal OPS1 propagates through the third waveguide 206. The third waveguide 206 is divided into the first and second waveguide arms 208 and 210 and the bend portion 212 that joins the first and second waveguide arms 208 and 210.

In the PIC 108 of FIG. 13, the first through third pluralities of contact pads CP1-CP5, CP6-CP10, and CP11-CP15 are not illustrated. However, it will be apparent to a person skilled in the art that the first waveguide arm 208 is formed between the first plurality of contact pads CP1-CP5 and the second plurality of contact pads CP6-CP10. Similarly, the second waveguide arm 210 is formed between the first plurality of contact pads CP1-CP5 and the third plurality of contact pads CP11-CP15. The current CI is injected in the PIC 108 by way of the first through third pluralities of contact pads CP1-CP5, CP6-CP10, and CP11-CP15. Further, the PIC 108 of FIG. 13 includes all other layers (e.g., the first and second metal layers 214 and 216 and the first contact layer 218), the AR coating 220, and the set of markers MR1-MR7 that are illustrated and described in FIG. 2, and are not illustrated in FIG. 13 to keep the illustration concise and clear.

The PIC 108 of FIG. 13 further includes the MMI coupler 1302 that is formed on the first and second waveguide arms 208 and 210 of the third waveguide 206. The MMI coupler 1302 can be a 2×2 3 decibel coupler that has a length equal to "3*(3/(2*L))", where L is a beat length of two lowest order modes of the MMI coupler 1302. The MMI coupler 1302 is configured to receive the first optical signal OPS1 by way of the first waveguide arm 208 and the first MFA 202, and split the first optical signal OPS1 into third and fourth optical signals OPS3 and OPS4. The MMI coupler 1302 splits the first optical signal OPS1 into third and fourth optical signals OPS3 and OPS4 based on a multi-mode interference therein. The first optical signal OPS1 is split into the third and fourth optical signals OPS3 and OPS4 such that the third optical signal OPS3 propagates from the first waveguide arm 208 to the second waveguide arm 210 by way of the bend portion 212. Similarly, the first optical signal OPS1 is split into the third and fourth optical signals OPS3 and OPS4 such the fourth optical signal OPS4 propagates from the second waveguide arm 210 to the first waveguide arm 208 by way of the bend portion 212. The MMI coupler 1302 is configured to output the second optical signal OPS2 by combining the third and fourth optical signals OPS3 and OPS4 that are amplified while propagating through the third waveguide 206. The MMI coupler 1302 is further configured to provide, by way of the second waveguide arm 210 and the second MFA 204, the second optical signal OPS2 to the second waveguide 104. The PIC 108 of FIG. 13 can be used in a silicon monolithic coherent transceiver.

FIG. 14 is a schematic diagram that illustrates the top view of the PIC of the silicon photonic device of FIG. 1, in accordance with yet another exemplary embodiment of the present disclosure. Referring to FIG. 14, there is shown the top view 200 of the PIC 108 that corresponds to the combination of the SOA (i.e., the PIC 108 of FIG. 2) and the DFB laser (hereinafter referred to and designated as the "DFB laser 1402").

The PIC 108 of FIG. 14 includes the first and second MFAs 202 and 204 on the same facet of the PIC 108, the third waveguide 206, and the first through third pluralities of contact pads CP1-CP5, CP6-CP10, and CP11-CP15. The third waveguide 206 extends between the first and second MFAs 202 and 204. The third waveguide 206 is divided into the first and second waveguide arms 208 and 210 and the bend portion 212 that joins the first and second waveguide arms 208 and 210. The PIC 108 of FIG. 14 further includes the DFB laser 1402 that is formed on the second waveguide arm 210 of the third waveguide 206. The DFB laser 1402 is configured to generate the first optical signal OPS1. The first optical signal OPS1 propagates through the third waveguide 206, and is amplified based on the current CI injected in the PIC 108. Further, the first optical signal OPS1 propagates through the third waveguide 206 such that the second optical signal OPS2 (i.e., the amplified version of the first optical signal OPS1) is outputted by way of the first MFA 202. In other words, the first MFA 202 is configured to receive the second optical signal OPS2 from the first waveguide arm 208, and provide the second optical signal OPS2 to the first waveguide 102. An output power of the PIC 108 of FIG. 14 is significantly greater than that of a conventional DFB laser assembly without the integrated SOA.

In the PIC 108 of FIG. 14, the first through third pluralities of contact pads CP1-CP5, CP6-CP10, and CP11-CP15 are not illustrated. However, it will be apparent to a person skilled in the art that the first waveguide arm 208 is formed between the first plurality of contact pads CP1-CP5 and the second plurality of contact pads CP6-CP10. Similarly, the second waveguide arm 210 is formed between the first plurality of contact pads CP1-CP5 and the third plurality of contact pads CP11-CP15. The current CI is injected in the PIC 108 by way of the first through third pluralities of contact pads CP1-CP5, CP6-CP10, and CP11-CP15. Further, the PIC 108 of FIG. 14 includes all other layers (e.g., the first and second metal layers 214 and 216 and the first contact layer 218), the AR coating 220, and the set of markers MR1-MR7 that are illustrated and described in FIG. 2, and are not illustrated in FIG. 14 to keep the illustration concise and clear.

FIG. 15 is a schematic diagram that illustrates the top view of the PIC of the silicon photonic device of FIG. 1, in accordance with another exemplary embodiment of the present disclosure. Referring to FIG. 15, there is shown the top view 200 of the PIC 108 that corresponds to the tunable laser.

The PIC 108 of FIG. 15 includes the first and second MFAs 202 and 204 on the same facet of the PIC 108, the third waveguide 206, and the first through third pluralities of contact pads CP1-CP5, CP6-CP10, and CP11-CP15. The third waveguide 206 extends between the first and second MFAs 202 and 204. The third waveguide 206 is divided into the first and second waveguide arms 208 and 210 and the bend portion 212 that joins the first and second waveguide arms 208 and 210.

The PIC 108 of FIG. 15 further includes a distributed Bragg reflector (DBR) 1502 that is formed on the second waveguide arm 210 of the third waveguide 206. The DBR 1502 is formed such that the PIC 108 corresponds to the tunable laser. In such a scenario, the bend portion 212 of the third waveguide 206 corresponds to a gain section of the tunable laser, and the first waveguide arm 208 of the third waveguide 206 corresponds to a phase section of the tunable laser. The DBR 1502 acts as a wavelength selection component to enable wavelength tunability, whereas the gain section of the tunable laser provides the optical gain. The tunable laser can be configured to output the second optical signal OPS2. The second optical signal OPS2 is the amplified version of the first optical signal OPS1. The first optical signal OPS1 propagates through the third waveguide 206, and is amplified based on the current CI injected in the PIC 108. The first optical signal OPS1 can be generated by the DBR 1502 and the gain section. The phase section of the tunable laser controls an optical phase of the first optical signal OPS1. Further, the second optical signal OPS2 is outputted by way of the first MFA 202. In other words, the first MFA 202 is configured to receive the second optical signal OPS2 from the first waveguide arm 208, and provide the second optical signal OPS2 to the first waveguide 102. The gain and phase sections of the tunable laser can be formed by controlling the injection of the current CI in the PIC 108.

In the PIC 108 of FIG. 15, the first through third pluralities of contact pads CP1-CP5, CP6-CP10, and CP11-CP15 are not illustrated. However, it will be apparent to a person skilled in the art that the first waveguide arm 208 is formed between the first plurality of contact pads CP1-CP5 and the second plurality of contact pads CP6-CP10. Similarly, the second waveguide arm 210 is formed between the first plurality of contact pads CP1-CP5 and the third plurality of contact pads CP11-CP15. The current CI is injected in the PIC 108 by way of the first through third pluralities of contact pads CP1-CP5, CP6-CP10, and CP11-CP15. Further, the PIC 108 of FIG. 15 includes all other layers (e.g., the first and second metal layers 214 and 216 and the first contact layer 218), the AR coating 220, and the set of markers MR1-MR7 that are illustrated and described in FIG. 2, and are not illustrated in FIG. 15 to make the illustrations concise and clear.

Various embodiments of the disclosure provide the PIC 108 that is included on the silicon photonic device 100. The PIC 108 is coupled to the first and second waveguides 102 and 104 that are included on the silicon photonic device 100. The PIC 108 includes the first and second MFAs 202 and 204, the third waveguide 206, and the first plurality of contact pads CP1-CP5, the second plurality of contact pads CP6-CP10, and the third plurality of contact pads CP11-CP15. The first and second MFAs 202 and 204 are on the same facet 205 of the PIC 108. One of the first and second MFAs 202 and 204 is configured to output the second optical signal OPS2 that is an amplified version of the first optical signal OPS1, and provide the second optical signal OPS2 to one of the first and second waveguides 102 and 104, respectively. The third waveguide 206 is configured to amplify the first optical signal OPS1 based on the current CI injected in the PIC 108. The third waveguide 206 extends between the first and second MFAs 202 and 204 such that the first optical signal OPS1 propagates through the third waveguide 206. The third waveguide 206 is divided into the first and second waveguide arms 208 and 210, and the bend portion 212 that joins the first and second waveguide arms 208 and 210. The first waveguide arm 208 is between the first plurality of contact pads CP1-CP5 and the second plurality of contact pads CP6-CP10. Further, the second waveguide arm 210 is between the first plurality of contact pads CP1-CP5 and the third plurality of contact pads CP11-CP15. The current CI is injected in the PIC 108 by way of the first through third pluralities of contact pads CP1-CP5, CP6-CP10, and CP11-CP15.

The disclosed embodiments encompass numerous advantages. Exemplary advantages of the disclosed PICs include, but are not limited to, ensuring a decrease in a size and a manufacturing cost of the PIC 108 and an increase in an optical performance of the PIC 108. As the third waveguide 206 of the PIC 108 has a loop-back structure, the input and output ports of the PIC 108 (e.g., the first and second MFAs 202 and 204) are on the same facet 205 of the PIC 108. Such an arrangement of the input and output ports ensures that the AR coating 220 is required on a single facet (i.e., the facet 205) of the PIC 108. The AR coating 220 on the facet 205 is deposited in a single run. As a result, the AR coating 220 at the input and output ports of the PIC 108 is uniform and does not experience variations arising from two separate deposition runs. Such an AR coating 220 at the input and output ports of the PIC 108 results in the optical performance of the PIC 108 of the present disclosure being greater than that of a conventional PIC. The conventional PIC corresponds to a PIC where input and output ports are on opposite facets of the PIC, and hence, separate runs of AR coating deposition are required which leads to variations in the AR coating at the input and output ports. Further, as the third waveguide 206 can correspond to the HIC waveguide or the MIC waveguide, the optical reflection at the bend portion 212 of the third waveguide 206 is significantly reduced. The reduction in the optical reflection at the bend portion 212 results in reduction in the radius of curvature of the bend portion 212. Thus, when the third waveguide 206 of the present disclosure and a waveguide of the conventional PIC have the same interaction length, a size of the third waveguide 206 of the present disclosure is less than that of the waveguide of the conventional PIC. Hence, a size and a manufacturing cost of the PIC 108 of the present disclosure are less than that of the conventional PIC.

Techniques consistent with the disclosure provide, among other features, a photonic integrated circuit for amplifying optical signals. While various exemplary embodiments of the disclosed photonic integrated circuit have been described above, it should be understood that they have been presented for purposes of example only, and not limitations. It is not exhaustive and does not limit the disclosure to the precise form disclosed. Modifications and variations are possible in light of the above teachings or may be acquired from practicing of the disclosure, without departing from the breadth or scope.

While various embodiments of the disclosure have been illustrated and described, it will be clear that the disclosure is not limited to these embodiments only. Numerous modifications, changes, variations, substitutions, and equivalents will be apparent to those skilled in the art, without departing from the spirit and scope of the disclosure, as described in the claims.

What is claimed is:

1. A photonic integrated circuit (PIC), comprising:
   a first mode field adapter (MFA) and a second MFA that are on a facet of the PIC, wherein
      one of the first MFA or the second MFA is configured to output a first optical signal that is an amplified version of a second optical signal, and
      the second optical signal is one of generated in the PIC or received by the PIC;
   a first waveguide that extends between the first MFA and the second MFA, wherein
      the second optical signal propagates through the first waveguide,
      the first waveguide is divided into a first waveguide arm, a second waveguide arm, and a bend portion,
      the bend portion joins the first waveguide arm and the second waveguide arm,
      the first waveguide arm integrates with the first MFA,
      a portion of the first waveguide arm is tilted at an angle,
      the second waveguide arm integrates with the second MFA,
      a portion of the second waveguide arm is tilted at the angle,
      each of the portion of the first waveguide arm and the portion of the second waveguide arm is opposite to the bend portion,
      the first waveguide is configured to amplify the second optical signal based on a current injected in the PIC,
      each MFA of the first MFA and the second MFA comprises:
         a second waveguide configured to one of:
            receive the second optical signal; or
            output the first optical signal;
         a tapered active wavequide core that extends between the second waveguide and the first waveguide, wherein the tapered active waveguide core enables one of:
            propagation of the second optical signal from the second waveguide to the first wavequide arm, or
            propagation of the first optical signal from the second waveguide arm to the second waveguide; and
         a third waveguide below the second waveguide, and the second waveguide is further configured to one of receive the second optical signal via the third waveguide or output the first optical signal via the third waveguide;
   a first waveguide structure;
   a second waveguide structure;
   a third waveguide structure;
   a first plurality of contact pads above the first waveguide structure;
   a second plurality of contact pads above the second waveguide structure; and
   a third plurality of contact pads above the second waveguide structure, wherein
      the first waveguide arm is between the first plurality of contact pads and the second plurality of contact pads,
      the second waveguide arm is between the first plurality of contact pads and the third plurality of contact pads, and
      the current is injected in the PIC via each of the first plurality of contact pads, the second plurality of contact pads, and the third plurality of contact pads.

2. The PIC of claim 1, wherein the first waveguide corresponds to one of a high index contrast waveguide or a medium index contrast waveguide.

3. The PIC of claim 1, further comprising an anti-reflection coating on the facet.

4. The PIC of claim 1, further comprising a set of markers to align the PIC on a silicon photonic device.

5. The PIC of claim 1, wherein each waveguide structure of the first waveguide structure, the second waveguide structure, and the third waveguide structure comprises:
   a first clad layer;
   an active waveguide core on the first clad layer; and
   a second clad layer on the active waveguide core.

6. The PIC of claim 1, further comprising:
   a first contact layer on each of the first waveguide structure, the second waveguide structure, and the third waveguide structure;
   a first dielectric layer on each of:
      a plurality of sidewalls of the third waveguide structure, and
      the first contact layer that is associated with the first waveguide structure,
   wherein the first dielectric layer is further in each of:
      a first region between the first waveguide structure and the third waveguide structure; and
      a second region between the second waveguide structure and the third waveguide structure;
   a first metal layer on each of the first dielectric layer and the first contact layer, wherein each contact pad of the first plurality of contact pads is on a portion, of the first metal layer, that is above the first waveguide structure; and
   a second metal layer on the first contact layer, wherein
      the second metal layer is further in the second region between the second waveguide structure and the third waveguide structure,
      the second metal layer overlaps with the first dielectric layer,
      each contact pad of the second plurality of contact pads and the third plurality of contact pads is on a portion of the second metal layer, and
      the portion of the second metal layer is above the second waveguide structure.

7. The PIC of claim 6, further comprising:
   a substrate; and
   a second contact layer above the substrate, wherein the second waveguide is between the second contact layer and the substrate, and each waveguide structure of the first waveguide structure, the second waveguide structure, and the third waveguide structure is on the second contact layer.

8. The PIC of claim 6, further comprising:
a substrate; and
a second contact layer on the substrate, wherein the second waveguide is between the second contact layer and each of the first waveguide structure, the second waveguide structure, and the third waveguide structure.

9. The PIC of claim 6, further comprising a second dielectric layer on each of the first metal layer and the second metal layer for passivation, wherein each of the first plurality of contact pads, the second plurality of contact pads, and the third plurality of contact pads is uncovered by the second dielectric layer.

10. The PIC of claim 1, further comprising:
a first contact layer on each of the first waveguide structure, the second waveguide structure, and the third waveguide structure;
a first dielectric layer on each of:
a plurality of sidewalls of the third waveguide structure; and
the first contact layer that is associated with each of the first waveguide structure and the second waveguide structure, wherein the first dielectric layer is further in each of:
a first region between the first waveguide structure and the third waveguide structure; and
a second region between the second waveguide structure and the third waveguide structure; and
a first metal layer on each of the first dielectric layer and the first contact layer that is associated with the third waveguide structure, wherein
each contact pad of the first plurality of contact pads is on a first portion, of the first metal layer, that is above the first waveguide structure, and
each contact pad of the second plurality of contact pads and the third plurality of contact pads is on a second portion, of the first metal layer, that is above the second waveguide structure.

11. The PIC of claim 10, further comprising:
a second metal layer; and
a substrate on the second metal layer, wherein each waveguide structure of the first waveguide structure, the second waveguide structure, and the third waveguide structure is above the substrate.

12. The PIC of claim 10, further comprising a second dielectric layer on the first metal layer for passivation, wherein each of the first plurality of contact pads, the second plurality of contact pads, and the third plurality of contact pads is uncovered by the second dielectric layer.

13. The PIC of claim 1, further comprising a grating on the second waveguide arm of the first waveguide, wherein
the grating is configured to reflect the second optical signal that propagates through the first waveguide, and
the first optical signal is outputted via the first MFA.

14. The PIC of claim 1, further comprising a multi-mode interference (MMI) coupler on each of the first waveguide arm and the second waveguide arm of the first waveguide, wherein the MMI coupler is configured to:
receive the second optical signal via the first waveguide arm and the first MFA; and
split the second optical signal into a third optical signal and a fourth optical signal, wherein the third optical signal propagates from the first waveguide arm to the second waveguide arm via the bend portion,
the fourth optical signal propagates from the second waveguide arm to the first waveguide arm via the bend portion,
the MMI coupler is further configured to output the first optical signal based on a combination of the third optical signal and the fourth optical signal, and
the MMI coupler is further configured to output the first optical signal via the second waveguide arm and the second MFA.

15. The PIC of claim 1, further comprising a distributed feedback (DFB) laser on the second waveguide arm of the first waveguide, wherein
the DFB laser is configured to generate the second optical signal,
the second optical signal propagates through the first waveguide, and
the first optical signal is outputted via the first MFA.

16. The PIC of claim 1, further comprising a distributed Bragg reflector (DBR) on the second waveguide arm of the first waveguide, wherein
the PIC corresponds to a tunable laser,
the bend portion of the first waveguide corresponds to a gain section of the tunable laser,
the first waveguide arm of the first waveguide corresponds to a phase section of the tunable laser, and
the tunable laser is configured to output the first optical signal via the first MFA.

17. A silicon photonic device, comprising:
a first waveguide; and
a photonic integrated circuit (PIC) coupled to the first waveguide, wherein the PIC comprises:
a first mode field adapter (MFA) and a second MFA that are on a facet of the PIC, wherein
one of the first MFA or the second MFA is configured to:
output a first optical signal that is an amplified version of a second optical signal; and
provide the first optical signal to the first waveguide, and
the second optical signal is one of generated in the PIC or received by the PIC;
a second waveguide that extends between the first MFA and the second MFA, wherein
the second optical signal propagates through the second waveguide,
the second waveguide is divided into a first waveguide arm, a second waveguide arm, and a bend portion,
the bend portion joins the first waveguide arm and the second waveguide arm,
the first waveguide arm integrates with the first MFA,
a portion of the first waveguide arm is tilted at an angle,
the second waveguide arm integrates with the second MFA,
a portion of the second waveguide arm is tilted at the angle,
each of the portion of the first waveguide arm and the portion of the second waveguide arm is opposite to the bend portion,
the second waveguide is configured to amplify the second optical signal based on a current injected in the PIC, each MFA of the first MFA and the second MFA comprises:
  a third waveguide configured to one of:
    receive the second optical signal; or
    output the first optical signal;
  a tapered active waveguide core that extends between the third waveguide and the second waveguide, wherein the tapered active waveguide core enables one of:
    propagation of the second optical signal from the third waveguide to the first wavequide arm, or
    propagation of the first optical signal from the second wavequide arm to the third waveguide; and
  a fourth waveguide below the third waveguide, and
the third waveguide is further configured to one of receive the second optical signal via the fourth waveguide, or output the first optical signal via the fourth waveguide;

a first waveguide structure;
a second waveguide structure;
a third waveguide structure;
a first plurality of contact pads above the first waveguide structure;
a second plurality of contact pads above the second waveguide structure; and
a third plurality of contact pads above the second waveguide structure, wherein
  the first waveguide arm is between the first plurality of contact pads and the second plurality of contact pads,
  the second waveguide arm is between the first plurality of contact pads and the third plurality of contact pads, and
  the current is injected in the PIC via each of the first plurality of contact pads, the second plurality of contact pads, and the third plurality of contact pads.

* * * * *